(12) United States Patent
Inaba

(10) Patent No.: US 7,456,472 B2
(45) Date of Patent: Nov. 25, 2008

(54) SEMICONDUCTOR DEVICE AND MANUFACTURING METHOD THEREOF

(75) Inventor: Satoshi Inaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 11/005,477

(22) Filed: Dec. 7, 2004

(65) Prior Publication Data

US 2006/0073647 A1 Apr. 6, 2006

(30) Foreign Application Priority Data

Sep. 30, 2004 (JP) ............................. 2004-287702

(51) Int. Cl.
*H01L 29/76* (2006.01)
(52) U.S. Cl. ...................... 257/341; 257/382
(58) Field of Classification Search ................ 257/341, 257/365, 366, 350, 401, 288, E27.099, E29.13
See application file for complete search history.

(56) References Cited

U.S. PATENT DOCUMENTS

| 5,910,677 | A | 6/1999 | Irino | |
|---|---|---|---|---|
| 6,507,124 | B2 | 1/2003 | Kumagai et al. | |
| 6,525,403 | B2 * | 2/2003 | Inaba et al. | 257/618 |
| 6,803,631 | B2 * | 10/2004 | Dakshina-Murthy et al. | 257/349 |
| 6,872,647 | B1 * | 3/2005 | Yu et al. | 438/585 |
| 6,888,187 | B2 * | 5/2005 | Brown et al. | 257/297 |
| 6,897,527 | B2 * | 5/2005 | Dakshina-Murthy et al. | 257/349 |
| 7,300,837 | B2 * | 11/2007 | Chen et al. | 438/213 |
| 2002/0036290 | A1 | 3/2002 | Inaba et al. | |
| 2002/0053739 | A1 | 5/2002 | Honma et al. | |
| 2003/0006795 | A1 * | 1/2003 | Asayama et al. | 324/763 |
| 2005/0051843 | A1 | 3/2005 | Inaba | |
| 2005/0077550 | A1 | 4/2005 | Inaba et al. | |
| 2007/0287256 | A1 | 12/2007 | Chang et al. | 438/283 |

(Continued)

FOREIGN PATENT DOCUMENTS

CN 1186342 A 7/1998

(Continued)

OTHER PUBLICATIONS

D. Hisamoto et al., "A Folded-channel MOSFET for Deep-sub-tenth Micron Era," IEDM Technology Digest, (1998), pp. 1032-1034.

(Continued)

*Primary Examiner*—Thao P. Le
(74) *Attorney, Agent, or Firm*—Foley & Lardner LLP

(57) ABSTRACT

A semiconductor device comprising a multi Fin-FET structure capable of suppressing short channel effects, controlling a threshold voltage, driving a high current, and operating in a high-speed comprises a source region and a drain region disposed on a semiconductor substrate, a plurality of fins interconnecting the source region and drain region, a first gate electrode disposed on the semiconductor substrate and to one side face of each fin, a second gate electrode disposed on the semiconductor substrate and to the other side face of the fin to face the first gate electrode, and separated from the first gate electrode, a plurality of first pad electrodes connected to respective first gate electrode, a first wiring interconnecting the plurality of first pad electrodes, a plurality of second pad electrodes connected to respective second gate electrode, and a second wiring interconnecting the plurality of second pad electrodes.

18 Claims, 17 Drawing Sheets

U.S. PATENT DOCUMENTS

| | | |
|---|---|---|
| 2007/0290250 A1 | 12/2007 | Clark et al. .................. 257/314 |
| 2007/0292996 A1 | 12/2007 | Abadeer et al. ............. 438/165 |
| 2008/0099795 A1 | 5/2008 | Bernstein et al. ............ 257/255 |
| 2008/0153213 A1 | 6/2008 | Fazan ......................... 438/155 |

FOREIGN PATENT DOCUMENTS

| | | |
|---|---|---|
| JP | 2001-298194 A | 10/2001 |
| JP | 2001-358232 A | 12/2001 |
| JP | 2002-110963 A | 4/2002 |
| JP | 2002-141482 A | 5/2002 |
| JP | 2003-298051 A | 10/2003 |

OTHER PUBLICATIONS

X. Y. Liu et al., "Flexible Threshold Voltage FinFETs with Independent Double Gates and an Ideal Rectangular Cross-Section Si-Fin Channel," IEDM Technology Digest, (2003), pp. 986-988.

Yang-Kyu Choi et al., "Sub-20nm CMOS FinFET Technologies," IEDM Technology Digest, (2001), pp. 421-424.

U.S. Appl. No. 11/097,387, filed Apr. 4, 2005, Inaba.

U.S. Appl. No. 11/100,559, filed Apr. 7, 2005, Inaba.

* cited by examiner

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2004-287702, filed Sep. 30, 2004, the entire contents of which are incorporated herein by reference.

BACKGROUND OF THE INVENTION

1. Field of the Invention

The present invention relates to a semiconductor device and its manufacturing method, and more particularly, to a semiconductor device comprising a field effect transistor including a strip shaped fin, and its manufacturing method.

2. Description of the Related Art

Conspicuously high performance of an integrated circuit has recently been achieved by miniaturization of elements which constitute a semiconductor device. Such miniaturization has been achieved by reducing of a gate length and/or thinning of a gate insulator of a metal insulator semiconductor field effect transistor (MISFET) used in a semiconductor device, e.g., a logical circuit, or a storage device, based on a so-called scaling law.

In the MISFET whose gate length is, e.g., 30 nm or less, it is a significant challenge to suppress short channel effects. As one of the suppressing methods, for example, Jpn. Pat. Appln. KOKAI Publication No. 2003-298051 discloses a Fin-FET in which a projected region is formed by finely processing a silicon substrate into a strip shape (referred to as a fin, hereinafter), and an MISFET of a 3-dimensional structure is formed therein. This example is a double gate Fin-FET in which a reverse U-shaped gate electrode is formed on one fin. In the double gate Fin-FET, equal potential is applied to the gate electrode covered on both sides of the fin, and channels are formed in side faces of the fin from both sides. In a fully depleted Fin-FET in which a depletion layer extended from the channel spreads over the entire thickness of the fin, when polysilicon is used for the gate electrode as typically used thereto, there is a difficulty in controlling a threshold voltage of the Fin-FET to a desired value. This problem is related to a work function of a gate electrode material, and can be controlled by using a material, which has a work function near a middle of an energy gap of silicon (mid-gap). However, it is difficult to find a proper material which has such characteristics.

Thus, a back gate Fin-FET has been proposed as a semiconductor device that realizes a desired threshold voltage by controlling a potential of a channel region (see, e.g., Y. K. Liu, M. Masahara, K. Ishii, T, Tsutsumi, T. Sekigawa, H. Takashima, H. Yamauchi and E. Suzuki: "Flexible Threshold Voltage Fin-FETs with Independent Double Gates and an Ideal Rectangular Cross-Section Si-Fin-channel", IEDM Tech. Dig., pp. 986-988, 2003). The back gate Fin-FET comprises a set of gate electrodes disposed to face side faces of the fin and to be independent of each other, i.e., a front gate and a back gate. Different potentials can be applied to the front gate and the back gate. For example, the front gate is used to control a channel formed in one side face of the fin, and the back gate is used to control a potential of the channel region. It has been reported that such a back gate Fin-FET can control a threshold voltage well.

Each of the two types of Fin-FET is in a single fin structure in which two gate electrodes are formed to one fin. Consequently, a channel width is narrow, i.e., a fin height is low, which is unsuitable to a semiconductor device for driving a large current. Since it is not easy to increase an effective channel width by setting a fin height to be high enough, a multi Fin-FET that comprises a plurality of fins arranged close to and in parallel one another has been presented in, e.g., "Sub-20 nm CMOS Fin-FET Technologies", IEDM Tech. Dig., pp. 421-424, 2001 by Yang-Kyu Choi, Nick Lindert, Peiqi Xuan, Stephen Tang, Daewon Ha, Erick Anderson, Tsu-Jae King, Jeffrey Bokor, and Chenming Hu. A structure described therein is a double gate multi Fin-FET, and there is no description of a back gate multi Fin-FET. In the double gate multi Fin-FET, one thin long gate electrode is vertically formed across the fins and one predetermined potential is applied to the gate electrode.

However, to realize the back gate multi Fin-FET, different potentials must be applied to two independent gate electrodes. Additionally, in the Fin-FET, since a source/drain and a channel are formed in a very narrow fin, reductions in parasitic resistance and parasitic capacitance are significant challenges to increase a current driving force and to achieve a high-speed switching operation. Yang-Kyu Choi et. al., have presented in the aforementioned paper a method of selectively growing a germanium layer in the source/drain of the fin to reduce parasitic resistance. However, a problem of an increase in the number of process steps is inherent in this method.

Therefore, there is a need to provide a semiconductor device comprising a multi Fin-FET structure capable of suppressing the short channel effects, controlling the threshold voltage, driving a high current, and operating in a high-speed, and its manufacturing method.

BRIEF SUMMARY OF THE INVENTION

According to one aspect of the present invention, a semiconductor device comprises: a source region and a drain region disposed on a semiconductor substrate; a plurality of fins which interconnect the source region and the drain region; a first gate electrode disposed on the semiconductor substrate and to one side face of each fin; a second gate electrode disposed on the semiconductor substrate and to the other side face of the fin to face the first gate electrode with respect to the fin, and separated from the first gate electrode; a plurality of first pad electrodes connected to respective first gate electrode; a first wiring which interconnects the plurality of first pad electrodes; a plurality of second pad electrodes connected to respective second gate electrode; and a second wiring which interconnects the plurality of second pad electrodes.

According to another aspect of the present invention, a semiconductor device comprises: a source region and a drain region disposed on a semiconductor substrate; a plurality of fins which interconnect the source region and the drain region; a gate electrode disposed on the semiconductor substrate to cover each fin; a plurality of stretched regions stretched from the source region or the drain region toward the gate electrode, and formed to be connected to adjacent fins; a plurality of pad electrodes connected to the gate electrode; and a wiring which interconnects the plurality of pad electrodes.

According to further aspect of the present invention, a method of manufacturing a semiconductor device comprises: forming an insulator on an active layer in a surface of a semiconductor substrate; forming a pattern of an active region including a plurality of fins in the active layer and the insulator; depositing a gate electrode material on the pattern of the active region; forming pluralities of first and second gate electrodes to face a side face of the fin, in opposition to each other with respect to the fin and to be separated from each other by processing the gate electrode material; introducing impurities of a first conductive type into the active region excluding a region thereof held between the first and second gate electrodes; forming a plurality of first pad electrodes to be connected to the first gate electrodes; forming a first wiring which interconnects the plurality of first pad electrodes; forming a plurality of second pad electrodes to be connected to the second gate electrodes; and forming a second wiring which interconnects the plurality of second pad electrodes.

According to still another aspect of the present invention, a method of manufacturing a semiconductor device comprises: forming a first insulator on a semiconductor substrate; forming a pattern of an active region including a plurality of fins in a surface region of the semiconductor substrate and the first insulator; introducing impurities of a first conductive type into the surface of the semiconductor substrate; depositing a second insulator on the semiconductor substrate to bury a lower portion of the fin; depositing a gate electrode material on the pattern of the active region; forming pluralities of first and second gate electrodes to face a side face of the fin, in opposition to each other with respect to the fin and to be separated from each other by processing the gate electrode material; introducing impurities of a second conductive type into the active region excluding a region held between the first and second gate electrodes; forming a plurality of first pad electrodes to be connected to the first gate electrode; forming a first wiring which interconnects the plurality of first pad electrodes; forming a plurality of second pad electrodes to be connected to the second gate electrode; and forming a second wiring which interconnects the plurality of second pad electrodes.

According to still another aspect of the present invention, a method of manufacturing a semiconductor device comprises: forming an insulator on an active layer disposed on a surface of a semiconductor substrate; forming a pattern of an active region including a source region, a drain region, a plurality of fins, and a stretched region stretched from the source region or the drain region and formed to be connected to an adjacent fin in the active layer and the insulator; depositing a gate electrode material on the pattern of the active region; forming gate electrodes to face a side face of the fin, in opposition to each other with respect to the fin and being connected each other by processing the gate electrode material; introducing impurities of a first conductive type into the active region excluding a region held between the gate electrodes; forming a plurality of pad electrodes to be connected to the gate electrodes; and forming a wiring which interconnects the plurality of pad electrodes.

DETAILED DESCRIPTION OF THE INVENTION

Figure 1A:
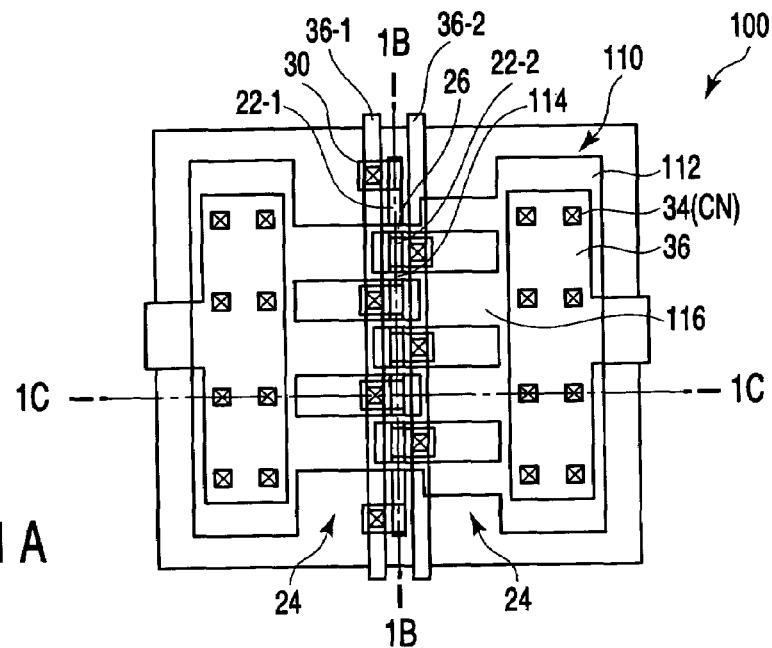
FIGS. 1A to 1C are views illustrating an example of a back gate multi Fin-FET according to a first embodiment of the present invention, FIG. 1A being a plane layout view, FIG. 1B being a sectional view along a gate electrode indicated by a line 1B-1B in FIG. 1A, and FIG. 1C being a sectional view of a direction perpendicular to the gate electrode indicated by a line 1C-1C in FIG. 1A.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit of the invention.

First Embodiment

The first embodiment of the invention is a semiconductor device in which a back gate multi Fin-FET is formed on a silicon-on-insulator (SOI) substrate. The SOI substrate 10 is a semiconductor substrate in which an SOI layer (a silicon layer) 16 as an active layer is formed via a buried oxide (BOX) layer 14 formed on a substrate 12, as shown in FIGS. 1B, 1C.

Figure 1B:
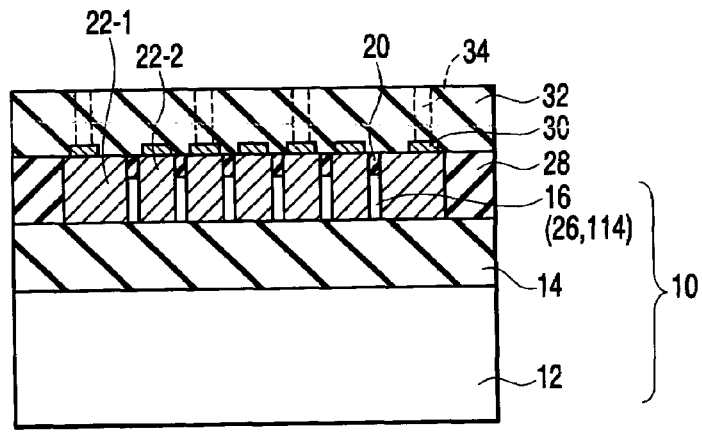
Figure 1C:
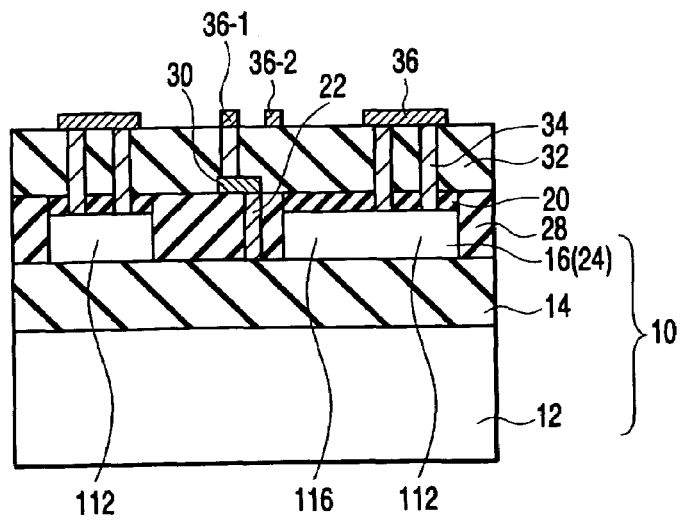

FIGS. 1A to 1C show an example of a back gate multi Fin-FET 100 according to the embodiment. FIG. 1A is a plane layout view, FIG. 1B is a sectional view along a gate electrode 22 indicated by a line 1B-1B in FIG. 1A, and FIG. 1C is a sectional view of a direction perpendicular to the gate electrode 22 indicated by a line 1C-1C in FIG. 1A.

As shown in FIG. 1A, the back gate multi Fin-FET 100 according to the embodiment comprises an active region 110, a gate electrode 22, and a wiring 36. The active region 110 is formed in the SOI layer 16, and comprises a contact region 112, a fin 114, and a stretched region 116. The contact region 112 is a region arranged in each of both sides of the drawing and has a wide area, on which a contact CN of a source/drain 24 is formed. In the drawings, six narrow fins 114 are formed to interconnect the contact regions 112 of both sides. However, the number of fins 114 is not limited to six. The gate electrode 22 is arranged in the center of each fin 114 to be orthogonal to the fin. In the center of the fin 114, a channel region 26 held between the gate electrodes 22 is formed (FIG. 1B), and both sides of the fin 114 become a source/drain 24.

The stretched region 116 is formed from either one of the contact region 112 of both sides toward the gate electrode 22 in the center and integrally with adjacent fin portions on both ends. In other words, the stretched region 116 lying between two fins 114 is formed to interconnect the two fins 114. Additionally, the stretched region 116 is formed to alternately stretch toward left and right of the fin 114 and above and below the fin 114. By forming the stretched region 116 in such a manner, an effective length of the fin 114 can be shortened, and parasitic resistance of the source/drain 24 can be reduced. Moreover, by disposing the stretched region 116, no increase will occur in parasitic resistance even when a distance to the contact region 112 facing the stretched region 116 between the fins 114 is increased.

The gate electrode 22 is separated by the fin 114, as shown in FIG. 1B. A plurality of separated gate electrodes 22 are connected to alternately two different gate wirings 36-1, 36-2 through independently disposed respective pad electrodes 30-1, 30-2. A first gate electrode 22-1 connected to the first wiring 36-1 works as, e.g., a front gate to control a channel. A second gate electrode 22-2 connected to the second wiring 36-2 works as, e.g., a back gate to control a potential of the channel region. Regarding the parasitic resistance of the gate electrode 22, since the gate electrode 22 is connected through the pad electrode 30 to the gate wirings 36-1, 36-2, the parasitic resistance can be reduced against that in the conventional double gate multi Fin-FET which directly uses the gate electrode for the wiring. As shown in FIGS. 1A, 1C, the pad electrode 30 connected to the gate electrode 22 is preferably formed on a first interlayer dielectric 28 not to overlap with the active region 110. It is for the purpose of reducing the parasitic capacitance of the Fin-FET. To arrange the pad electrode 30 in such a manner, a distance between the fins 114 is preferably set larger than that between the fins of the conventional double gate multi Fin-FET. Further, since the gate wirings 36-1, 36-2 can be formed independently of the gate electrodes 22-1, 22-2, there is less restriction in size.

An example of a manufacturing process of the back gate multi Fin-FET 100 according to the embodiment will be described below by referring to FIGS. 2A to 6C. Here, an example of an n-channel MOSFET will be taken. However, a p-channel MOSFET and a complimentary MOS (CMOS) FET can be manufactured in a similar process.

Figure 2A:
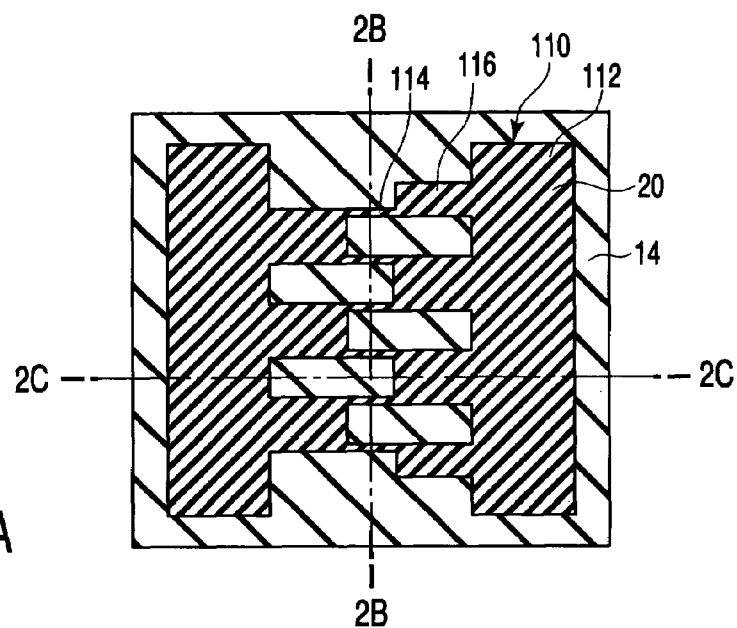
FIGS. 2A to 2C are views showing an example of a manufacturing process of the back gate multi Fin-FET according to the first embodiment of the invention, FIG. 2A being a plan view, FIG. 2B being a sectional view of a vertical direction indicated by a line 2B-2B in FIG. 2A, and FIG. 2C being a sectional view of a horizontal direction indicated by a line 2C-2C in FIG. 2A.
Figure 2B:
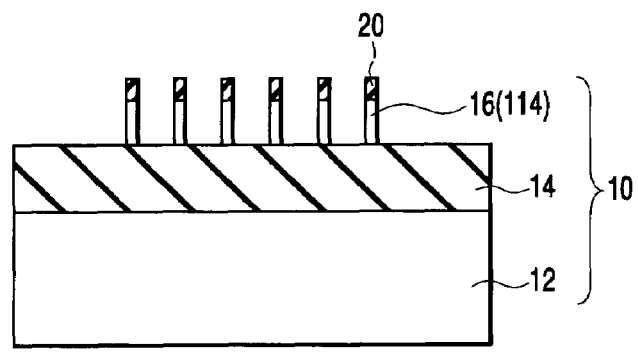
Figure 2C:
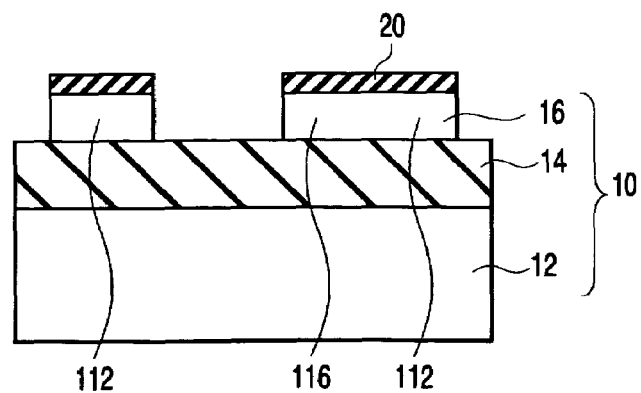

(1) As shown in FIGS. 2A to 2C, the SOI layer 16 of the SOI substrate 10 is being patterned to the active region 110. FIG. 2A is a plan view, FIG. 2B is a sectional view in a vertical direction indicated by a line 2B-2B in FIG. 2A, and FIG. 2C is a sectional view in a horizontal direction indicated by a line 2C-2C in FIG. 2A.

First, a first insulator film 20 is formed on an entire surface of the p-type SOI layer 16 of the SOI substrate 10. The first insulator film 20 is used as a hard mask for patterning the SOI layer 16, as an etching stopper for subsequently processed chemical mechanical polishing (CMP), or the like. For the first insulator film 20, for example, a silicon nitride film (SiN film) or a silicon oxide film ($SiO_2$ film) formed by chemical vapor deposition (CVD) can be used. The SiN film is used in the embodiment.

A pattern of the active region 110 is formed in the SiN film 20 by lithography and etching. Further, using the SiN film 20 as a mask, the SOI layer 16 is processed by anisotropic reactive ion etching (RIE). Thus, as shown in FIGS. 2A to 2C, the active region 110 that includes two contact regions 112, a plurality of fins 114 and a plurality of stretched regions 116 is formed in the SOI layer 16. As described above, the stretched regions 116 are formed to alternately stretch toward left and right of the fin 114 and above and below the fin 114. Additionally, the stretched region 116 lying between the two fins is formed to interconnect bases of the two fins and to fill a portion therebetween. By forming the stretched region 116 in such a manner, it can be shorten a length of the thin fin 114. In other words, parasitic resistance of the fin can be reduced.

Figure 3A:
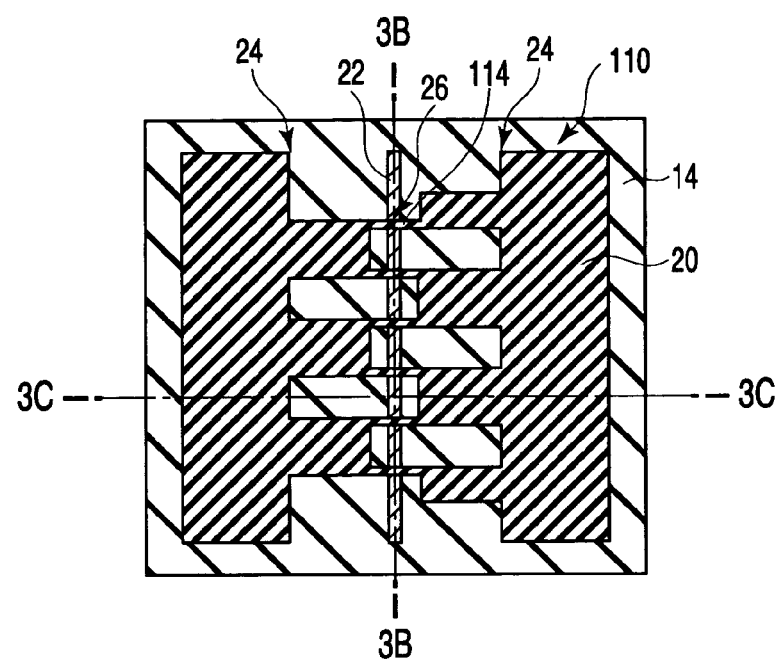
FIGS. 3A to 3C are views showing the example of the manufacturing process of the back gate multi Fin-FET according to the first embodiment subsequent to FIGS. 2A to 2C, FIG. 3A being a plan view, FIG. 3B being a sectional view of a vertical direction indicated by a line 3B-3B in FIG. 3A, and FIG. 3C being a sectional view of a horizontal direction indicated by a line 3C-3C in FIG. 3A.
Figure 3B:
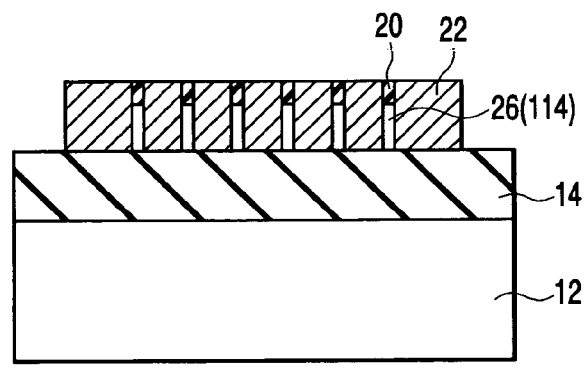
Figure 3C:
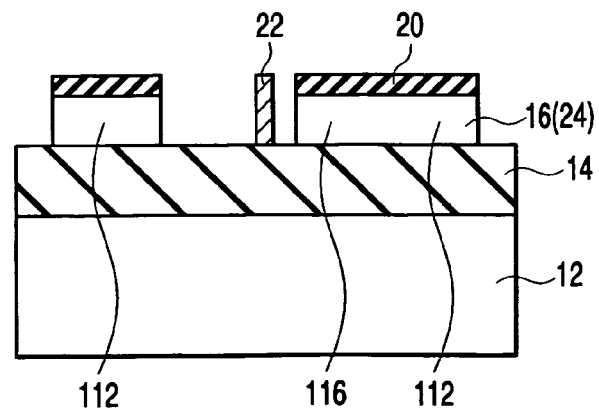

(2) Next, as shown in FIGS. 3A to 3C, a gate electrode 22 is being formed. FIG. 3A is a plan view, FIG. 3B is a sectional view along the gate electrode 22 indicated by a line 3B-3B in FIG. 3A, and FIG. 3C is a sectional view of a direction perpendicular to the gate electrode 22 indicated by a line 3C-3C in FIG. 3A.

A gate insulator (not shown) is formed on an entire surface including side faces of the active region 110. For the gate insulator, for example, an $SiO_2$ film formed by thermal oxidation, a silicon oxy-nitride film (SiON film) formed by plasma nitridation or oxidizing an SiN film, or a high dielectric constant insulator having a dielectric constant higher than these films, such as hafnium silicate (HfSiO) or hafnium silicon oxynitride (HfSiON) can be used.

A first polysilicon film 22 that is a gate electrode material is deposited on an entire surface of the gate insulator. By using the SiN film 20 as a stopper, the first polysilicon film 22 is polished and planarized by CMP. As a result of the CMP, the first polysilicon film 22 is separated by the fin 114. The planarization of the CMP can be replaced by a method of polishing the polysilicon film by the CMP until just before the SiN film 20 is exposed, then executing etching-back to a surface of the SiN film 20 by dry etching or wet etching, thus exposing the SiN film 20.

Subsequently, the first polysilicon film 22 is processed by lithography and etching, and separated gate electrodes 22 are formed as shown in FIGS. 3A, 3B. Then, n-type impurities, e.g., arsenic (As), is ion-implanted to an entire surface at a high concentration to dope the active region 110 and the gate electrode 22 excluding a center part of the fin 114 between the gate electrodes 22. A region of the active region 110 doped with As becomes a source/drain 24. A region in the center of the fin 114 not doped with As becomes a channel region 26.

In the example above, it has been described the polysilicon is used as the gate electrode. However, a material containing a metal, e.g., tantalum nitride (TaN), titanium nitride (TiN), tungsten silicide (WSi), nickel silicide (NiSi), nickel silicon germanium (NiSiGe), nickel germanium (NiGe) or the like, can be used for the gate electrode.

Figure 4A:
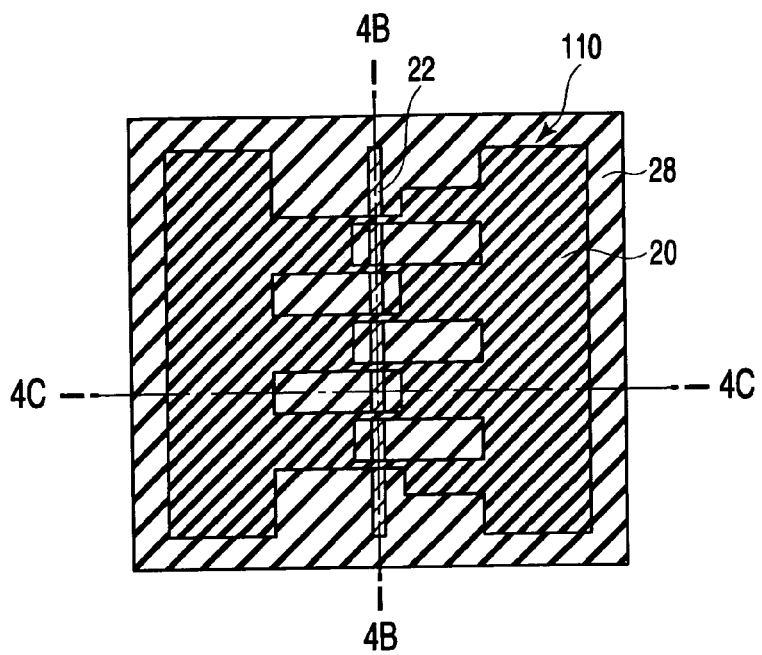
FIGS. 4A to 4C are views showing the example of the manufacturing process of the back gate multi Fin-FET according to the first embodiment subsequent to FIGS. 3A to 3C, FIG. 4A being a plan view, FIG. 4B being a sectional view along the gate electrode indicated by a line 4B-4B in FIG. 4A, and FIG. 4C being a sectional view of a direction perpendicular to the gate electrode indicated by a line 4C-4C in FIG. 4A.
Figure 4B:
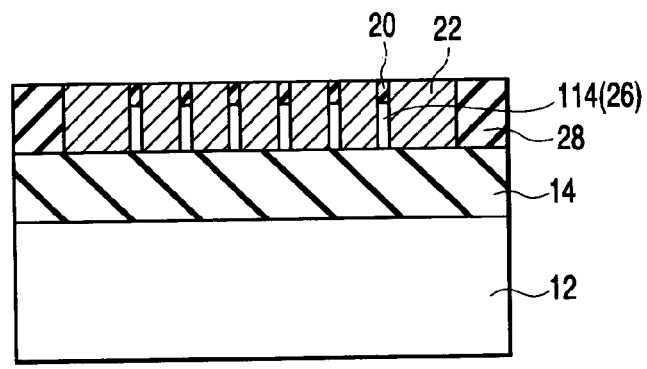
Figure 4C:
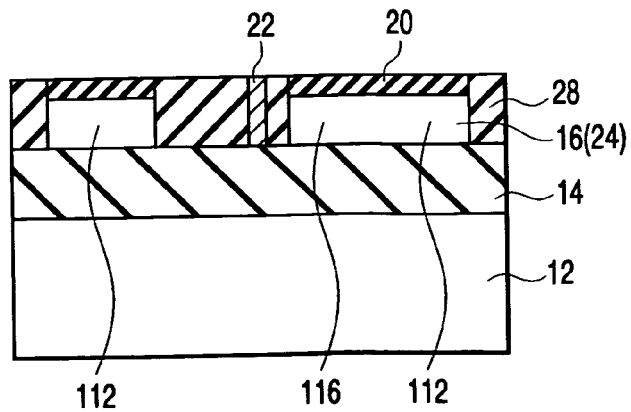

(3) Next, as shown in FIG. 4A to 4C, a first interlayer dielectric 28 is being formed in a region other than the active region 110 and the gate electrode 22. FIG. 4A is a plan view, FIG. 4B is a sectional view along the gate electrode 22 indicated by a line 4B-4B in FIG. 4A, and FIG. 4C is a sectional view of a direction perpendicular to the gate electrode 22 indicated by a line 4C-4C in FIG. 4A.

The first interlayer dielectric 28 is deposited on an entire surface of the SOI substrate 10 on which the active region 110 and the gate electrode 22 have been formed. For the first interlayer dielectric 18, a low dielectric constant insulator such as methylpolysiloxane (MSX) or hydrogen sylsisoxane (HSQ) is preferably used. However, an $SiO_2$ film can be used, also.

Subsequently, using the SiN film 20 and the gate electrode 22 as stoppers, the first interlayer dielectric 28 is planarized by CMP. As in the case of the planarization of the first polysilicon film 22, the planarization can be replaced by a combination of the CMP and dry etching or wet etching. By adding the etching, it can be prevented causing unnecessary CMP processing damage to the gate electrode 22.

In this way, the entire portion is planarized as shown in FIGS. 4A to 4C.

Figure 5A:
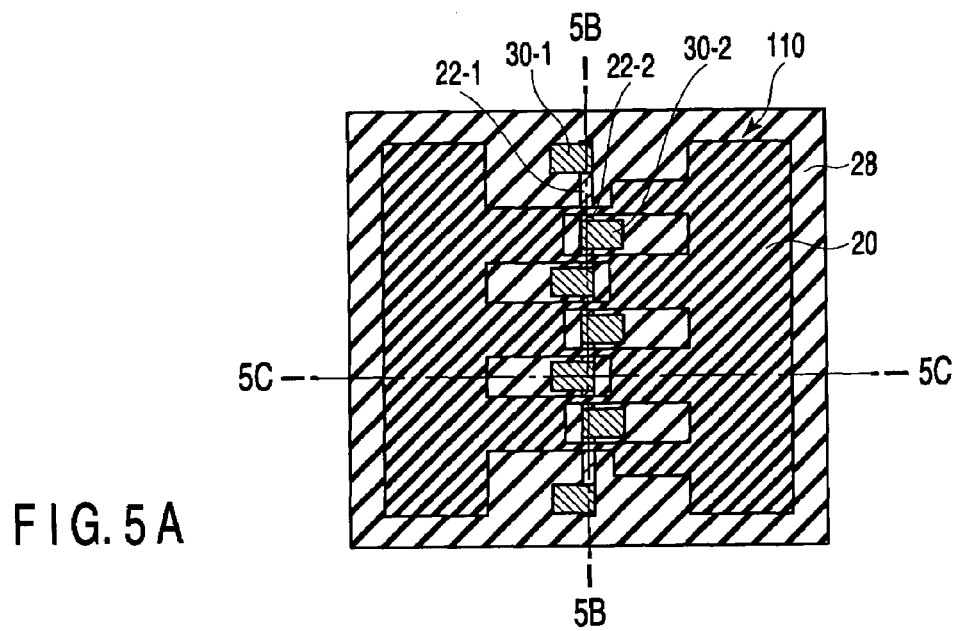
FIGS. 5A to 5C are views showing the example of the manufacturing process of the back gate multi Fin-FET according to the first embodiment subsequent to FIGS. 4A to 4C, FIG. 5A being a plan view, FIG. 5B being a sectional view along the gate electrode indicated by a line 5B-5B in FIG. 5A, and FIG. 5C being a sectional view of a direction perpendicular to the gate electrode indicated by a line 5C-5C in FIG. 5A.
Figure 5B:
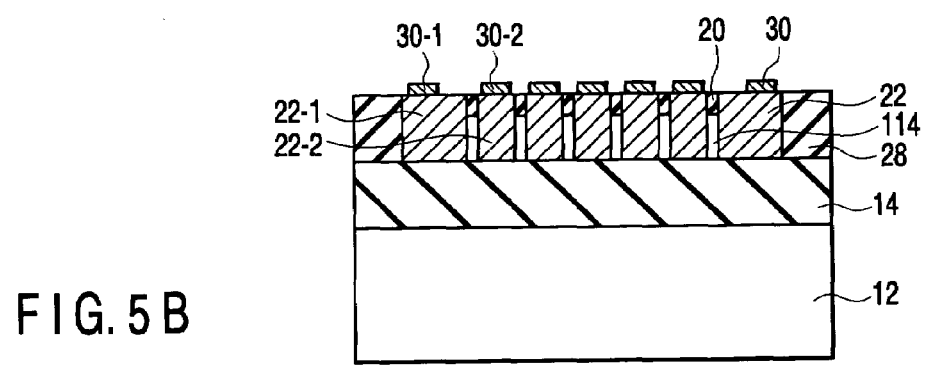
Figure 5C:
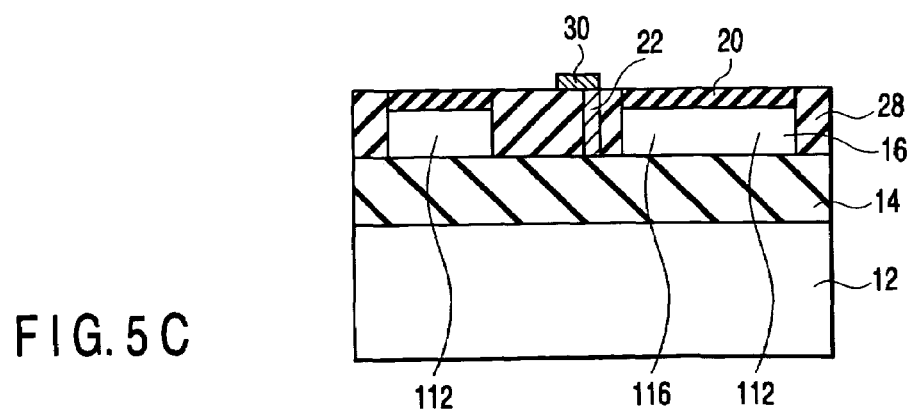

(4) Next, as shown in FIGS. 5A to 5C, a pad electrode 30 is being formed to be connected a wiring 36 with the gate electrode 22. FIG. 5A is a plan view, FIG. 5B is a sectional view along the gate electrode 22 indicated by a line 5B-5B in FIG. 5A, and FIG. 5C is a sectional view of a direction perpendicular to the gate electrode 22 indicated by a line 5C-5C in FIG. 5A.

First, a native oxide film formed on an upper surface of the gate electrode 22 is removed. A second polysilicon film 30, for example, doped with a high concentration of phosphorus (P), is deposited on an entire surface. The second polysilicon film 30 is processed by lithography and etching to form the pad electrode 30. Thus, as shown in FIGS. 5A to 5C, the pad electrode 30 connected to each of the separately formed gate electrodes 22 is formed. As shown in FIG. 5A, the pad electrodes 30 are formed to alternately locate left and right side to the gate electrodes 22 which is separated by the fin 114. By forming the pad electrodes 30 in such a manner, for example, first pad electrodes 30-1 connected to first gate electrodes 22-1 which work as front gates are arranged on the left of the gate electrodes 22, and second pad electrodes 30-2 connected to second gate electrodes 22-2 which work as back gates are arranged on the right. Thus, the first and second pad electrodes can be arranged left and right. Further, the pad electrode 30 is preferably formed on the first interlayer dielectric 28 not to overlap with the active region 110. By forming the pad electrode 30 in such a manner, it can be reduced a parasitic capacitance of FET.

For the second polysilicon film 30, doped polysilicon to which n-type impurities, such as As, are doped during the deposition is preferably used. However, undoped polysilicon can be used. In this case, the second polysilicon film 30 is doped with n-type impurities after its deposition. Additionally, in place of the polysilicon, for example, a material containing a metal similar to that described above for the gate electrode material can be used.

Figure 6A:
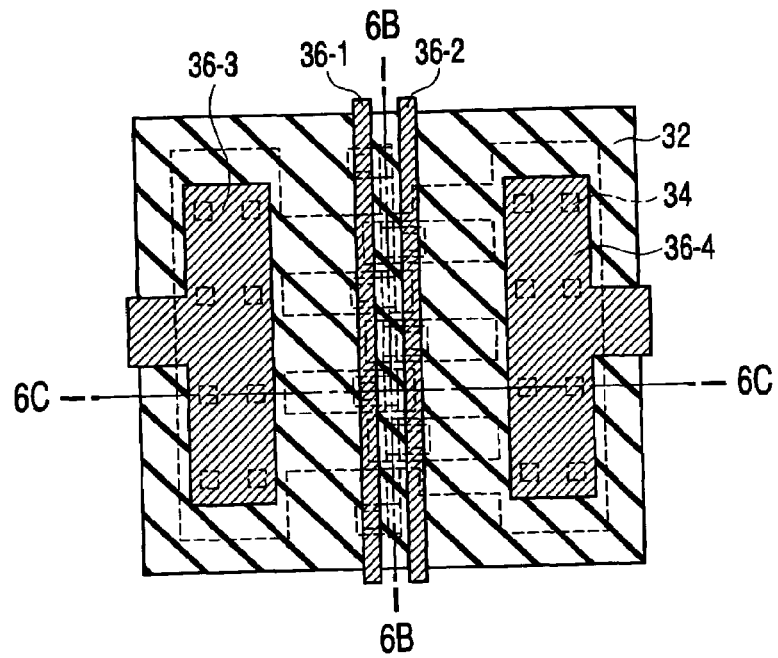
FIGS. 6A to 6C are views showing the example of the manufacturing process of the back gate multi Fin-FET according to the first embodiment subsequent to FIGS. 5A to 5C, FIG. 6A being a plan view, FIG. 6B being a sectional view along the gate electrode indicated by a line 6B-6B in FIG. 6A, and FIG. 6C being a sectional view of a direction perpendicular to the gate electrode indicated by a line 6C-6C in FIG. 6A.
Figure 6B:
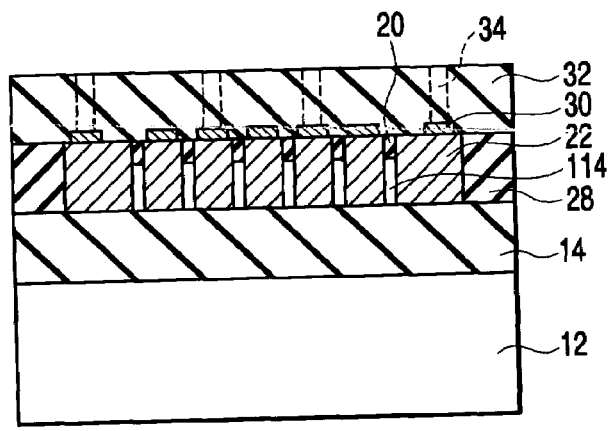
Figure 6C:
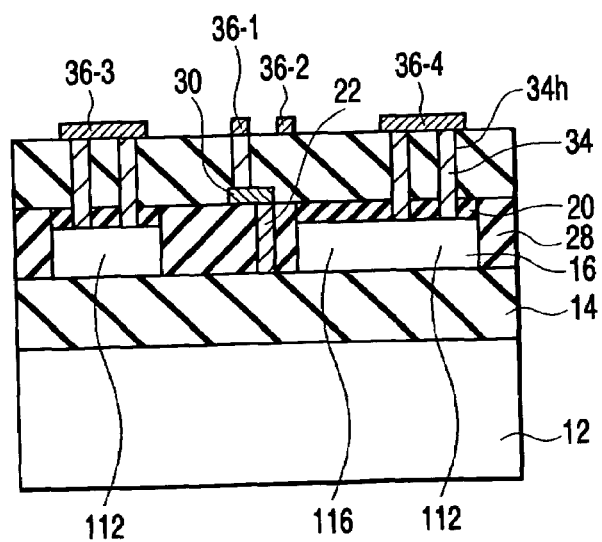

(5) Next, as shown in FIGS. 6A to 6C, wirings 36-1 to 36-4 to be connected to the pad electrode 30 and the contact region 112 are being formed. FIG. 6A is a plan view, FIG. 6B is a sectional view along the gate electrode 22 indicated by a line 6B-6B in FIG. 6A, and FIG. 6C is a sectional view of a direction perpendicular to the gate electrode 22 indicated by a line 6C-6C in FIG. 6A.

A second interlayer dielectric 32 is formed on an entire surface including on the pad electrode 30. The second interlayer dielectric 32 is preferably a low dielectric constant film as in the case of the first interlayer dielectric 28. However, other insulators can be used. The second interlayer dielectric 32 can be planarized as needed. Contact holes 34h are formed in the second interlayer dielectric 32 on the pad electrode 30 and in the second interlayer dielectric 32 and the SiN film 20 on the contact region 112 at predetermined positions by lithography and etching.

Then, a wiring material is deposited on an entire surface including the inside of the contact hole 34h to fill the same. For the wiring material, a high melting point metal, such as tungsten (W), or copper (Cu) can be used. By patterning the wiring material formed on the surface, a wiring 36-1 connected to the first gate electrode 22-1 via the pad electrode 30-1, a wiring 36-2 connected to the second gate electrode 22-2 via the pad electrode 30-2, and wirings 36-3, 36-4 connected to the source/drain 24 are formed. Thus, the contact plugs 34 and the wirings 36 can be formed. The gate wirings 36-1, 36-2 can be formed independently of the gate electrode 22, therefore there are less restrictions in size. Since the gate electrodes 22-1, 22-2 are connected to the gate wirings 36-1, 36-2 through the pad electrodes 30-1, 30-2, the parasitic resistance of the gate electrode 22 can be reduced against that of the conventional double gate multi Fin-FET which directly uses the gate electrode for the wiring.

Furthermore, executing steps such as multilayer wiring necessary for the semiconductor device, the semiconductor device comprising the back gate multi Fin-FET 100 is completed.

For the formation of the gate electrode 22 and the first interlayer dielectric 28 described above in the steps (3) and (4) of the embodiment, a method called a sidewall transfer process can be used. Not shown in figures, for the formation of the gate electrode 22, first, an insulator film is deposited on an entire surface of the substrate after forming the pattern of the active region 110 thereon. The insulator film is patterned to form an island-shaped so that an edge of the insulator film and a center of the fin to be formed a gate electrode 22 can coincide with each other. This patterning has an advantage of making smooth pattern edge to reduce irregularities caused by fine gate patterning because the insulator film pattern is large. A gate electrode material is deposited on an entire surface thereof by a predetermined thickness, i.e., a width of the gate electrode 22. Subsequently, the gate electrode material of a planar portion is removed by anisotropic RIE, and the gate electrode 22 is left only around the side faces of the patterned insulator film. Then, a first interlayer dielectric 28 is deposited on an entire surface, and a gate electrode 22 and a first interlayer dielectric 28 similar to those shown in FIGS. 4B, 4C can be formed. The gate electrode 22 is in a loop shape. However, there is no problem to apply the shape as it is to the embodiment.

As described above, according to the back gate multi Fin-FET-100 according to the embodiment, it can be reduced the parasitic resistance and the parasitic capacitance of the Fin-FET and the parasitic resistance of the gate electrode 22 as well.

Therefore, according to the embodiment, it is provided the semiconductor device comprising the back gate multi Fin-FET 100 using the SOI substrate 10 and having the structure capable of suppressing the short channel effects, controlling the threshold voltage, driving a high current, and operating in a high-speed, and its manufacturing method.

Second Embodiment

Figure 7A:
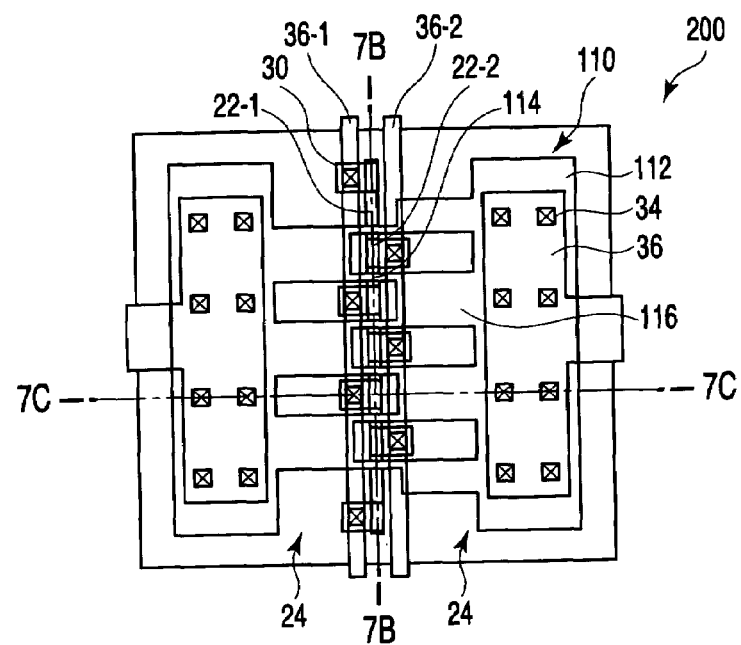
FIGS. 7A to 7C are views illustrating an example of a back gate multi Fin-FET according to a second embodiment of the present invention, FIG. 7A being a plane layout view, FIG. 7B being a sectional view along a gate electrode indicated by a line 7B-7B in FIG. 7A, and FIG. 7C being a sectional view of a direction perpendicular to the gate electrode indicated by a line 7C-7C in FIG. 7A.
Figure 7B:
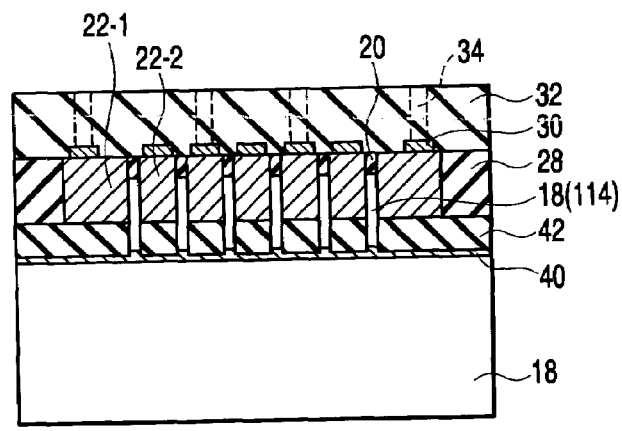
Figure 7C:
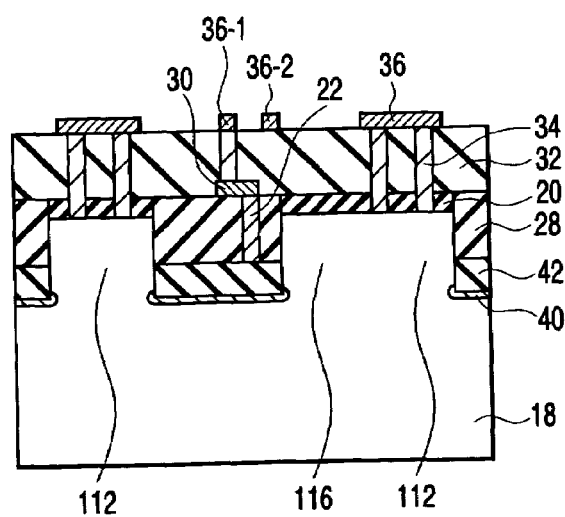

According to a second embodiment, as shown in FIGS. 7A to 7C, a back gate multi Fin-FET 200 is formed by using a bulk silicon substrate 18 in place of the SOI substrate used in the first embodiment. In the case of using the bulk silicon substrate 18, a fin region 114 and the silicon substrate 18 is not insulated. Thus, a semiconductor region 40 with a conductive type opposed to that of a channel must be formed in a bottom portion of the fin 114 to prevent elongation of the channel to the silicon substrate 18.

FIGS. 7A to 7C show an example of a back gate multi Fin-FET 200 according to the embodiment: FIG. 7A is a plane layout view, FIG. 7B is a sectional view along a gate electrode 22 indicated by a line 7B-7B in FIG. 7A, and FIG. 7C is a sectional view of a direction perpendicular to the gate electrode 22 indicated by a line 7C-7C in FIG. 7A. As in the case of the first embodiment, the embodiment will be described by taking an example of an n-channel MOSFET. However, the same holds true for a p-channel MOSFET and CMOSFET.

As shown in FIG. 7A, the plane layout of the back gate multi Fin-FET 200 according to the embodiment is the same as that of the first embodiment. The back gate multi Fin-FET 200 comprises an active region 110, a gate electrode 22, and a wiring 36 formed on a silicon substrate 18. Details thereof will be omitted. As shown in FIGS. 7B, 7C, a p-type semiconductor region 40 doped with p-type impurities, e.g., a high concentration of born B, is formed in the silicon substrate 18 of the bottom portion of the fin 114 to prevent elongation of the channel formed in the fin 114 to the silicon substrate 18. Further, the bottom portion of an active region 110 is buried in an insulator 42 to prevent contact of a gate electrode 22 with the silicon substrate 18.

An example of a manufacturing process of the back gate multi Fin-FET 200 according to the embodiment will be described below by referring to FIGS. 8A to 10C. Incidentally, as described above, the plane layout is the same as that of the first embodiment.

Figure 8A:
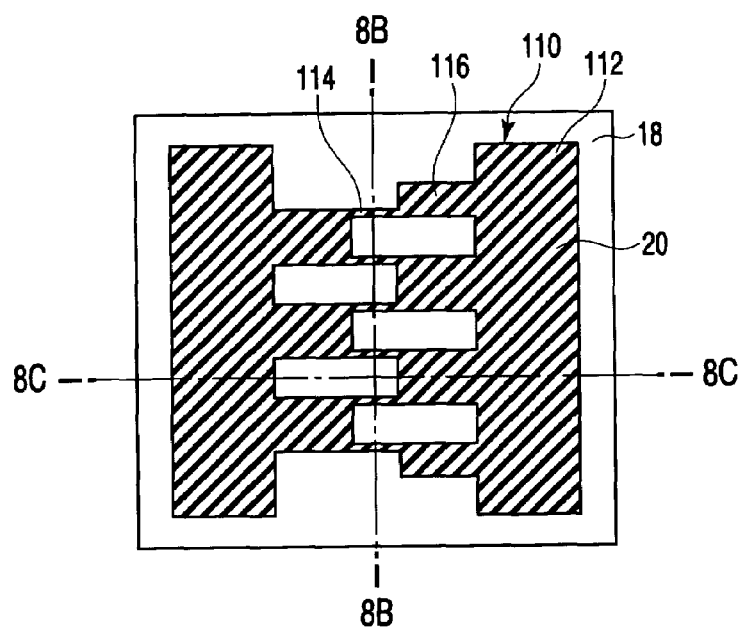
FIGS. 8A to 8C are views showing an example of a manufacturing process of the back gate multi Fin-FET according to the second embodiment of the invention, FIG. 8A being a plan view, FIG. 8B being a sectional view of a vertical direction indicated by a line 8B-8B in FIG. 8A, and FIG. 8C being a sectional view of a horizontal direction indicated by a line 8C-8C in FIG. 8A.
Figure 8B:
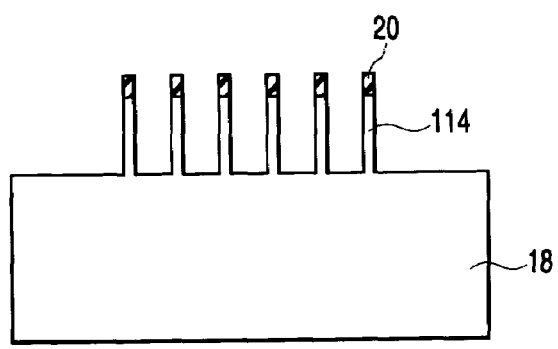
Figure 8C:
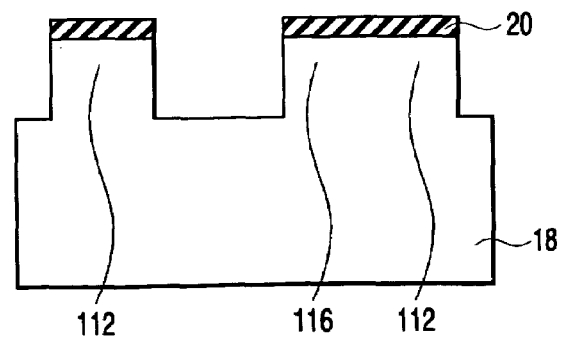

(1) FIGS. 8A to 8C are views after forming a pattern of the active region 110 in the silicon substrate 18 by a method similar to that of the step (1) of the first embodiment. FIG. 8A is a plan view, FIG. 8B is a sectional view of a vertical direction indicated by a line 8B-8B in FIG. 8A, and FIG. 8C is a sectional view of a horizontal direction indicated by a line 8C-8C in FIG. 8A.

As shown in FIGS. 8A to 8C, the active region 110 projected from the silicon substrate 18 is formed by lithography and etching. The active region 110 includes contact regions 112, fins 114 and stretched regions 116, and is patterned by using a first insulator film 20, e.g., an SiN film 20 as a hard mask. A height of the active region 110 from a bottom of the silicon substrate 18 is larger than the thickness of the SOI layer 16 of the first embodiment.

Figure 9A:
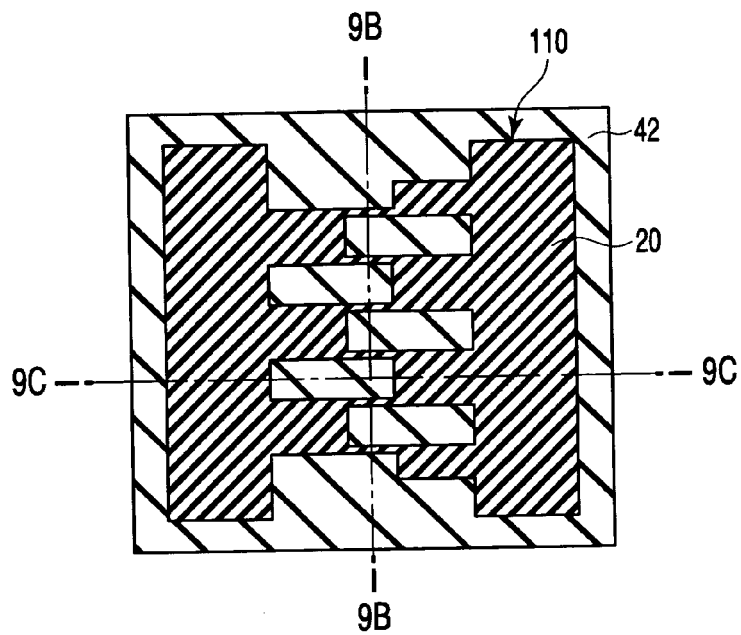
FIGS. 9A to 9C are views showing the example of the manufacturing process of the back gate multi Fin-FET according to the second embodiment subsequent to FIGS. 8A to 8C, FIG. 9A being a plan view, FIG. 9B being a sectional view of a vertical direction indicated by a line 9B-9B in FIG. 9A, and FIG. 9C being a sectional view of a horizontal direction indicated by a line 9C-9C in FIG. 9A.
Figure 9B:
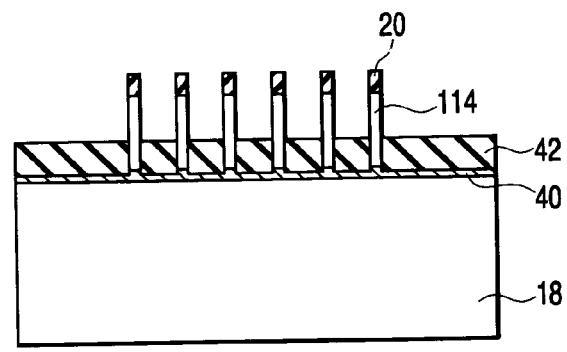
Figure 9C:
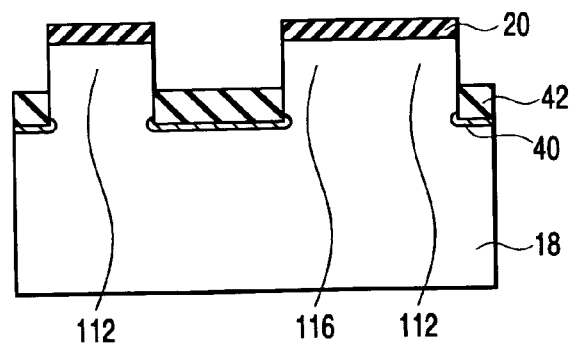

(2) Next, as shown in FIGS. 9A to 9C, a p-type semiconductor region 40 is being formed at a bottom portion of the fin 114 and active region 110, and the bottom portion of the active region 110 is being buried in a second insulator 42. FIG. 9A is a plan view, FIG. 9B is a sectional view of a vertical direction indicted by a line 9B-9B in FIG. 9A, and FIG. 9C is a sectional view of a horizontal direction indicated by a line 9C-9C in FIG. 9A.

Impurities of a p-type, e.g., boron B, are ion-implanted in an entire surface of the silicon substrate 18, and a p-type semiconductor region 40 is formed in the bottom of the silicon substrate 18. Subsequently, a second insulator 42 is deposited thick on an entire surface to fill a groove between the active regions 110 formed in the silicon substrate 18. Then, using an SiN film 20 as a stopper, the second insulator 42 is planarized by CMP, thus the second insulator 42 formed above the SiN film 20 is removed. Further, the second insulator 42 is etched back by dry etching or wet etching, so that the second insulator 42 is formed only on the silicon substrate 18 in the bottom of the groove. Thus, a structure shown in FIGS. 9A to 9C can be formed.

Figure 10A:
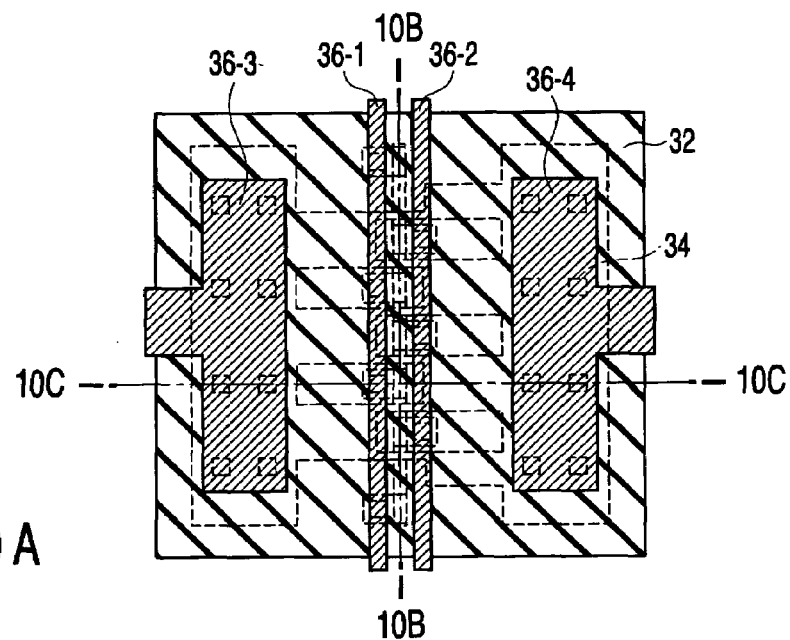
FIGS. 10A to 10C are views showing the example of the manufacturing process of the back gate multi Fin-FET according to the second embodiment subsequent to FIGS. 9A to 9C, FIG. 10A being a plan view, FIG. 10B being a sectional view along the gate electrode indicated by a line 10B-10B in FIG. 10A, and FIG. 10C being a sectional view of a direction perpendicular to the gate electrode indicated by a line 10C-10C in FIG. 10A.
Figure 10B:
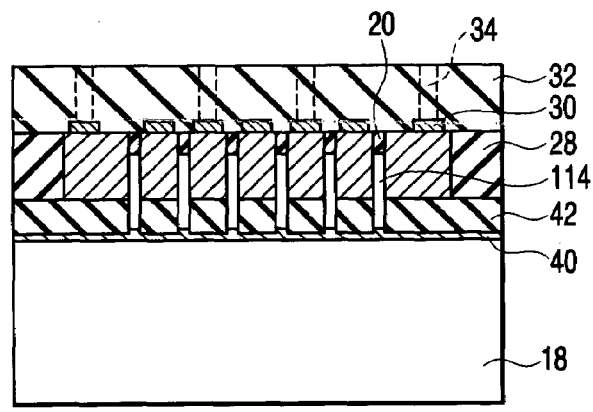
Figure 10C:
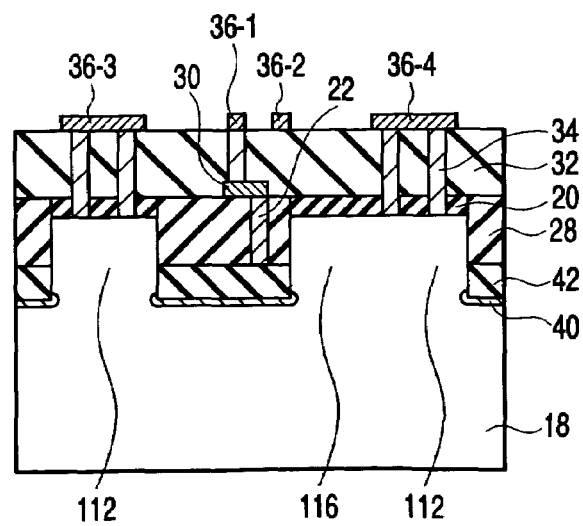

Thereafter, by executing from the step (2) of forming the gate electrode 22 to the step (5) of forming the wiring 36 in the first embodiment, a structure shown in FIGS. 10A to 10C is formed.

FIG. 10A is a plan view, FIG. 10B is a sectional view along a gate electrode 22 indicated by a line 10B-10B in FIG. 10A, and FIG. 10C is a sectional view of a direction perpendicular to the gate electrode 22 indicated by a line 10C-10C in FIG. 10A.

Specifically, a gate electrode 22, a pad electrode 30, and a wiring 36 are formed. Thus, the back gate multi Fin-FET 200 can be formed by using the silicon substrate 18. The back gate multi Fin-FET 200 comprises the p-type semiconductor region 40 and the insulator 42 both formed in the bottom portion of the fin 114 formed in the silicon substrate 18, the first and second gate electrodes 22 formed to face each other by sandwiching the fin 114, and the stretched region 116 formed from the contact region 112 toward the gate electrode 22. Since gate wirings 36-1, 36-2 can be formed independently of the gate electrodes 22-1, 22-2, there is no restriction in size. Since the gate electrodes 22-1, 22-2 are connected to the gate wirings 36-1, 36-2 through the pad electrodes 30-1, 30-2, parasitic resistance of the gate electrode 22 can be reduced more than that of the conventional double gate multi Fin-FET, in which the gate electrode is directly used for the wiring. As a result, the back gate multi Fin-FET 200 according to the embodiment can reduce the parasitic resistance and the parasitic capacitance of the Fin-FET and the parasitic resistance of the gate electrode 22.

Furthermore, by executing steps such as multilayer wiring necessary for the semiconductor device, the semiconductor device that comprises the back gate multi Fin-FET 200 is completed.

Thus, according to the embodiment, it can be provided the semiconductor device comprising the back gate multi Fin-FET 200 using the bulk silicon substrate 18 and having the structure capable of suppressing the short channel effects, controlling the threshold voltage, driving a high current, and operating in a high-speed, and its manufacturing method.

Third Embodiment

A Fin-FET which comprises an active region 110 having a stretched region 116 of the first embodiment can be applied to a double gate Fin-FET 300.

Figure 11A:
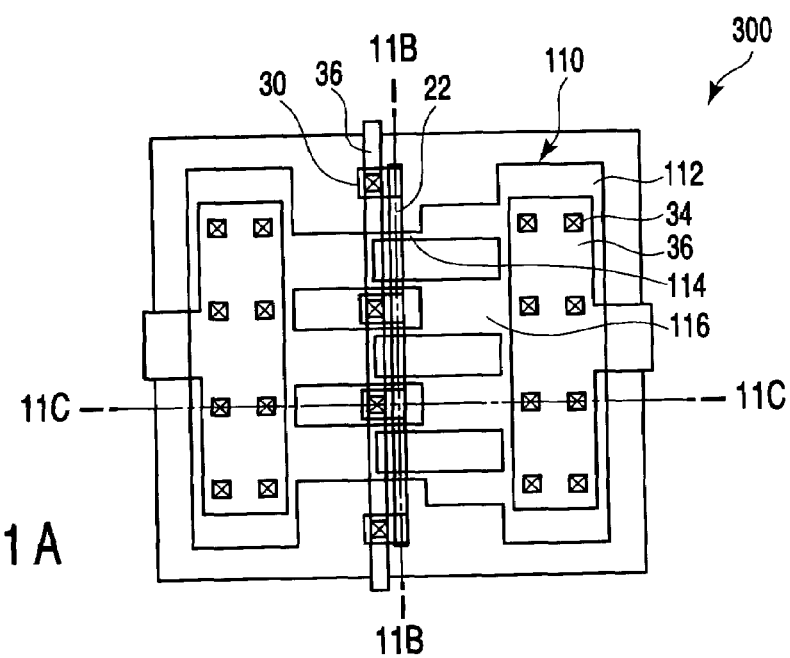
FIGS. 11A to 11C are views illustrating an example of a double gate multi Fin-FET according to a third embodiment of the present invention, FIG. 11A being a plane layout view, FIG. 11B being a sectional view along a gate electrode indicated by a line 11B-11B in FIG. 11A, and FIG. 11C being a sectional view of a direction perpendicular to the gate electrode indicated by a line 11C-11C in FIG. 11A.
Figure 11B:
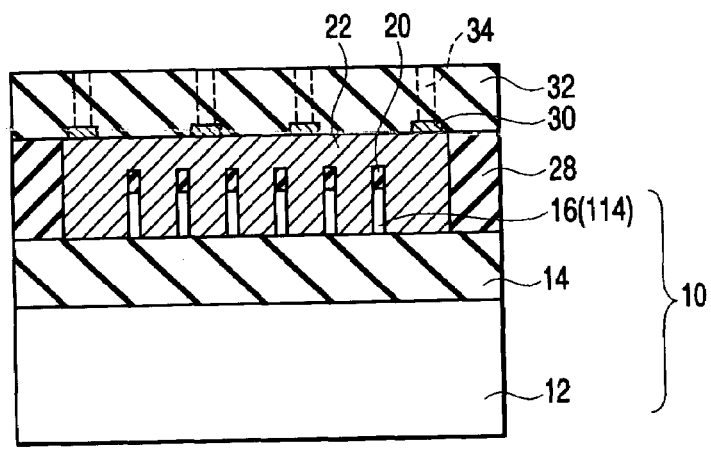
Figure 11C:
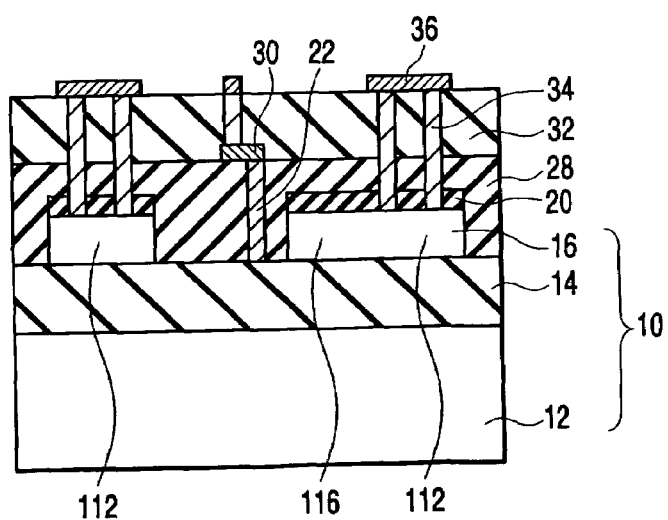

FIGS. 11A to 11C show an example of forming a double gate multi Fin-FET 300 by using an SOI substrate 10. FIG. 11A is a plane layout view, FIG. 11B is a sectional view along a gate electrode 22 indicated by a line 11B-11B in FIG. 11A, and FIG. 11C is a sectional view of a direction perpendicular to the gate electrode 22 indicated by a line 11C-11C in FIG. 11A.

As shown in FIG. 11B, a gate electrode 22 of the double gate multi Fin-FET 300 is not divided by a fin 114, but continuously formed to cover the fins 114. Thus, a height of the gate electrode 22 is higher than that of the back gate multi Fin-FET described above with reference to the first and second embodiments. Additionally, a pad electrode 30 is not formed for each space between the fins 114. However, pad electrodes 30 can be formed alternately as shown in FIG. 11A. By forming the pad electrodes 30 in such a manner, a gate wiring 36 can be formed only on one side of the gate electrode 22. By using the gate wiring 36 to shunt the gate electrode 22, it can be prevented from lowering a gate potential applied to a gate electrode 22 positioned apart from the pad electrode 30 due to parasitic resistance of the gate electrode 22.

As describe above, only by changing the formation process of the gate electrode 22, and a pattern of the pad electrode 30 and the gate wiring 36 of the first embodiment, it can be formed the double gate multi Fin-FET 300 by using the SOI substrate 10.

According to the double gate multi Fin-FET 300 of the embodiment, since a parasitic resistance of the fin 114 can be reduced, and a parasitic capacitance caused by overlapping of the pad electrode 30 with the active region 110 can be reduced, a high current driving force can be provided, and a high-speed operation can be performed.

Various changes and modifications can be made of the first to third embodiments. Some examples will be described. However, the invention is not limited to the examples.

(Modification 1)

Figure 12A:
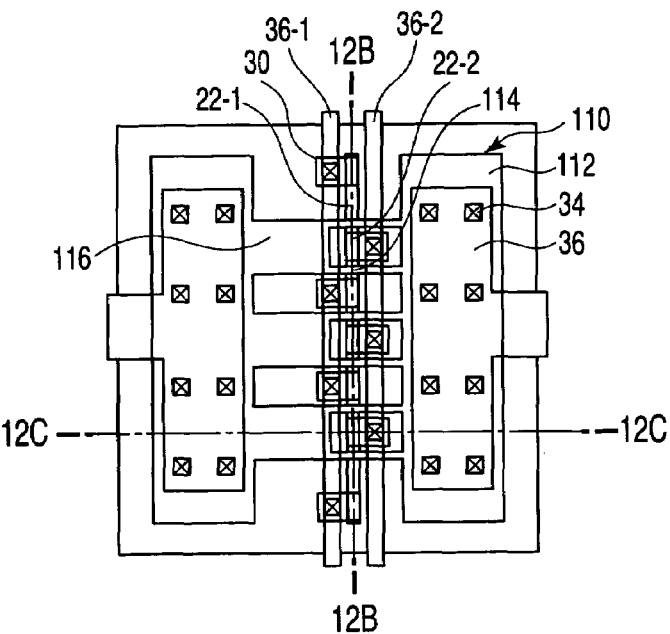
FIGS. 12A to 12C are views illustrating an example of a back gate multi Fin-FET according to a first modification of the present invention, FIG. 12A being a plane layout view, FIG. 12B being a sectional view along a gate electrode indicated by a line 12B-12B in FIG. 12A, and FIG. 12C being a sectional view of a direction perpendicular to the gate electrode indicated by a line 12C-12C in FIG. 12A.
Figure 12B:
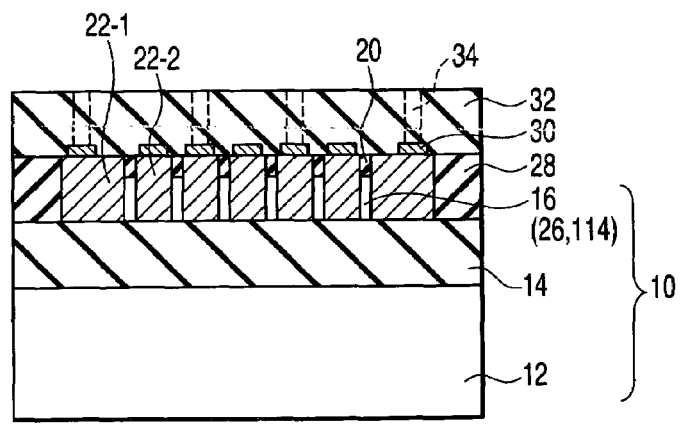
Figure 12C:
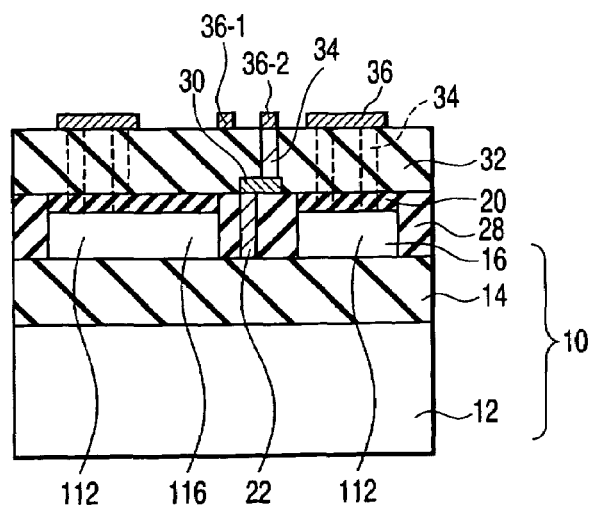

A modification 1 is a case in which a stretched region 116 is formed only on one side of a back gate multi Fin-FET of the first embodiment using the SOI substrate 10. FIGS. 12A to 12C show an example therein FIG. 12A is a plane layout view, FIG. 12B is a sectional view along a gate electrode 22 indicated by a line 12B-12B in FIG. 12A, and FIG. 12C is a sectional view of a direction perpendicular to the gate electrode 22 indicated by a line 12C-12C in FIG. 12A.

When forming the stretched region 116 only on one side, the stretched region 116 is preferably arranged on a source side of the Fin-FET. This arrangement enables to prevent lowering a potential applied to a channel region 26 due to parasitic resistance in the fin 114. In FIGS. 12A to 12C, a left side of the drawing is fixed to the source, and the stretched region 116 is formed only from a contact region 112 of the left side. Accordingly, when forming the stretched region 116 only from the source side, a length of the fin 114 from the channel region 26 to the contact region 112 of the drain side (right side in FIGS. 12A and 12C) is shortened as much as possible within a range in which a pad electrode 30 does not overlap with an active region 110. Thus, it can be reduced a parasitic resistance, suppressed a deterioration in the current driving force, and performed a high-speed operation.

(Modification 2)

Figure 13A:
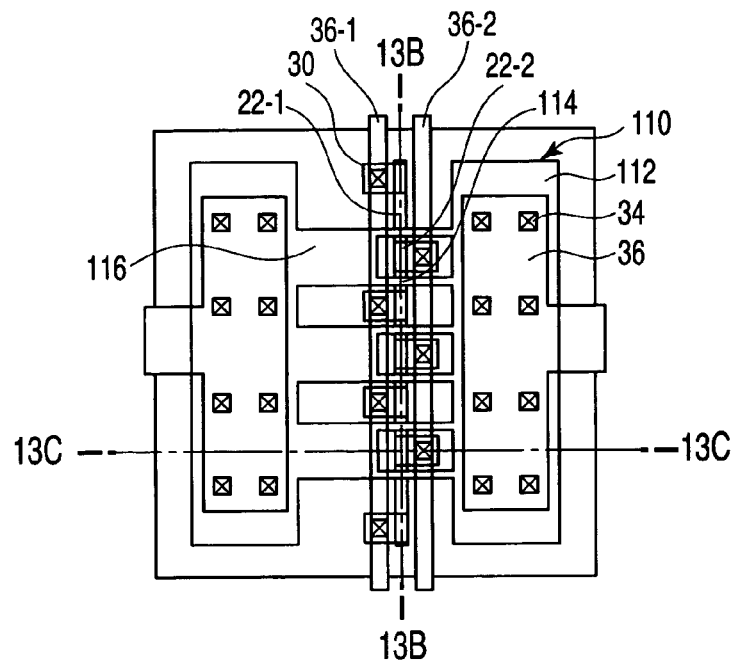
FIGS. 13A to 13C are views illustrating an example of a back gate multi Fin-FET according to a second modification of the present invention, FIG. 13A being a plane layout view, FIG. 13B being a sectional view along a gate electrode indicated by a line 13B-13B in FIG. 13A, and FIG. 13C being a sectional view of a direction perpendicular to the gate electrode indicated by a line 13C-13C in FIG. 13A.
Figure 13B:
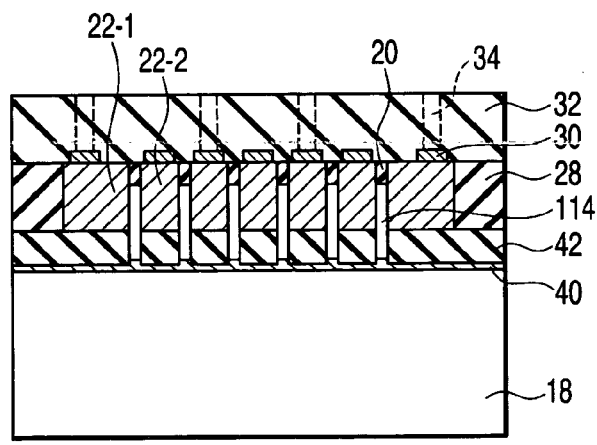
Figure 13C:
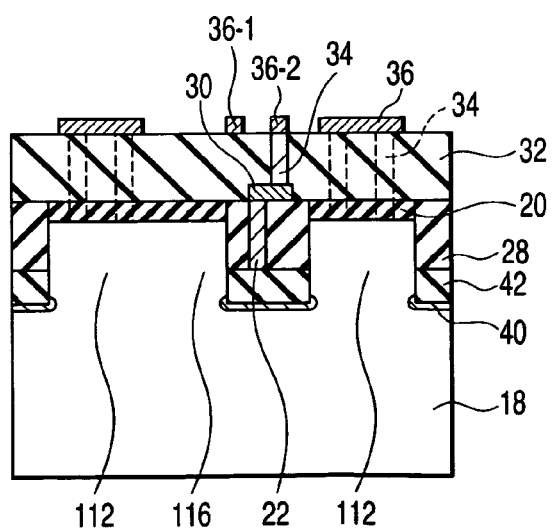

A modification 2 is a case in which a stretched region 116 is formed only on one side of a back gate multi Fin-FET of the second embodiment using the bulk silicon substrate 18. FIGS. 13A to 13C show an example therein FIG. 13A is a plane layout view, FIG. 13B is a sectional view along a gate electrode 22 indicated by a line 13B-13B in FIG. 13A, and FIG. 13C is a sectional view of a direction perpendicular to the gate electrode 22 indicated by a line 13C-13C in FIG. 13A.

As in the case of the modification 1, the stretched region 116 is formed only from the source side. Thus, it can be reduced a parasitic resistance, suppressed a deterioration in the current driving force, and performed a high-speed operation.

(Modification 3)

Figure 14A:
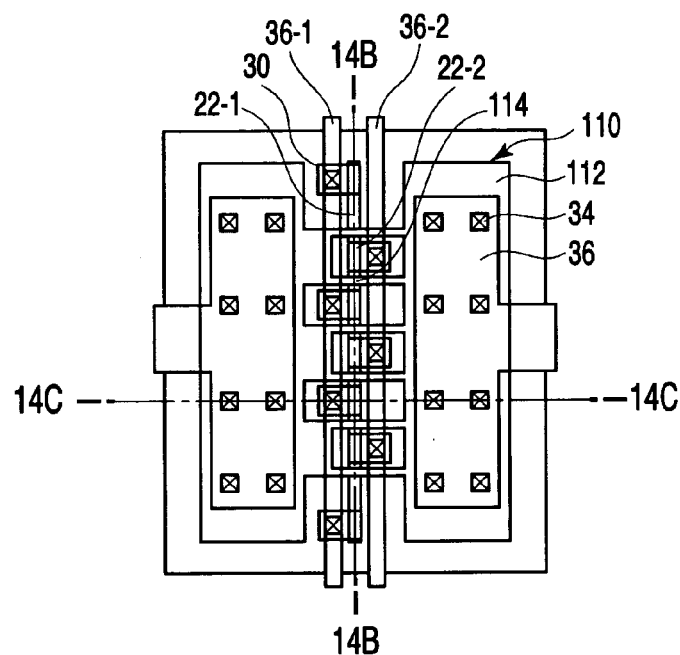
FIGS. 14A to 14C are views illustrating an example of a back gate multi Fin-FET according to a third modification of the present invention, FIG. 14A being a plane layout view, FIG. 14B being a sectional view along a gate electrode indicated by a line 14B-14B in FIG. 14A, and FIG. 14C being a sectional view of a direction perpendicular to the gate electrode indicated by a line 14C-14C in FIG. 14A.
Figure 14B:
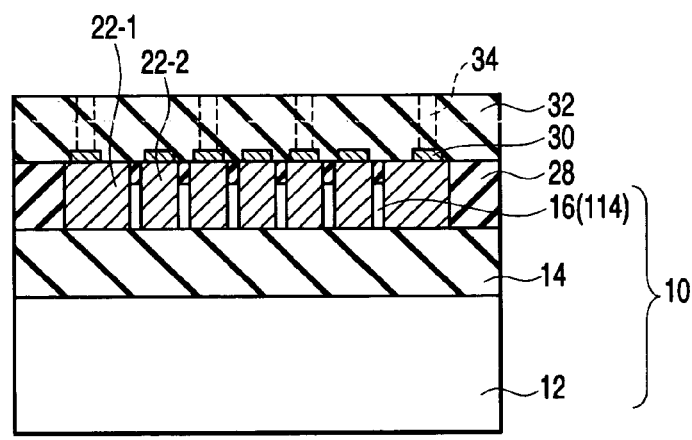
Figure 14C:
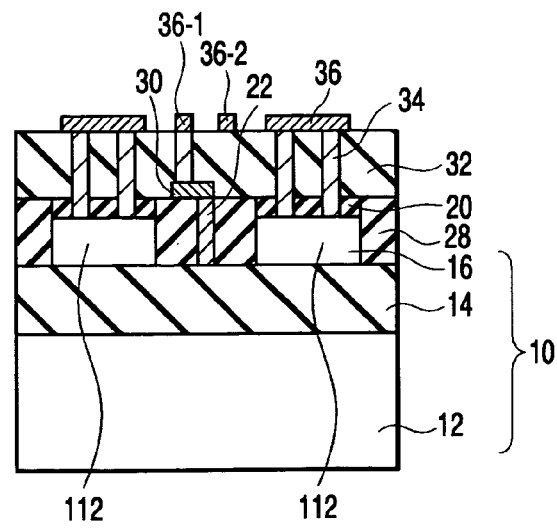

A modification 3 is a case in which no stretched region 116 is formed in a back gate multi Fin-FET of the first embodiment using the SOI substrate 10. FIGS. 14A to 14C show an example therein FIG. 14A is a plane layout view, FIG. 14B is a sectional view along a gate electrode 22 indicated by a line 14B-14B in FIG. 14A, and FIG. 14C is a sectional view of a direction perpendicular to the gate electrode 22 indicated by a line 14C-14C in FIG. 14A.

When no stretched region 116 is formed, a length of a fin 114 between contact regions 112 of source and drain sides is shortened as much as possible within a range in which a pad electrode 30 does not overlap with an active region 110. Thus, it can be reduced an influence of parasitic resistance, suppressed a deterioration in a current driving force, and performed a high-speed operation.

(Modification 4)

Figure 15A:
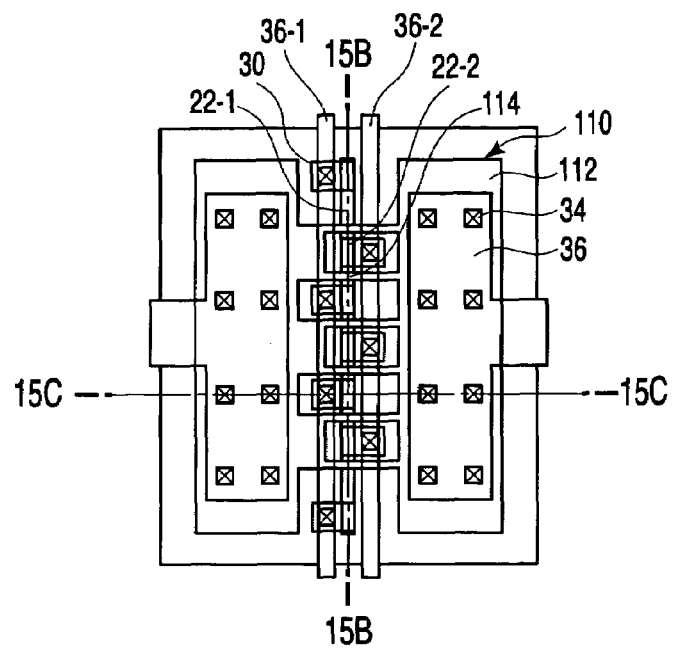
FIGS. 15A to 15C are views illustrating an example of a back gate multi Fin-FET according to a fourth modification of the present invention, FIG. 15A being a plane layout view, FIG. 15B being a sectional view along a gate electrode indicated by a line 15B-15B in FIG. 15A, and FIG. 15C being a sectional view of a direction perpendicular to the gate electrode indicated by a line 15C-15C in FIG. 15A.
Figure 15B:
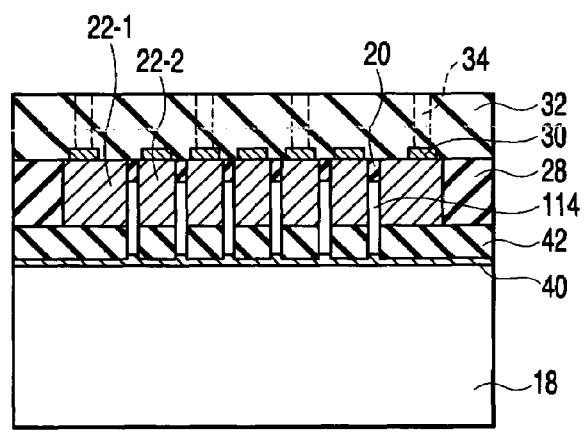
Figure 15C:
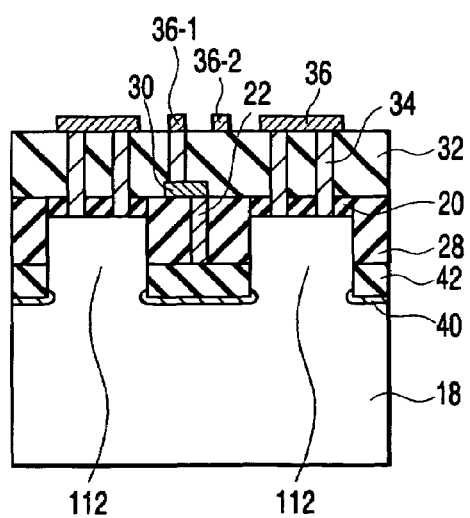

A modification 4 is a case in which no stretched region 116 is formed in a back gate multi Fin-FET of the second embodiment using the bulk silicon substrate 18. FIGS. 15A to 15C show an example therein FIG. 15A is a plane layout view, FIG. 15B is a sectional view along a gate electrode 22 indicated by a line 15B-15B in FIG. 15A, and FIG. 15C is a sectional view of a direction perpendicular to the gate electrode 22 indicated by a line 15C-15C in FIG. 15A.

As in the case of the modification 3, a length of a fin 114 between contact regions 112 of source and drain sides is shortened as much as possible within a range in which a pad electrode 30 does not overlap with an active region 110. Thus, it can be reduced an influence of parasitic resistance, suppressed a deterioration in a current driving force, and performed a high-speed operation.

(Modification 5)

Figure 16A:
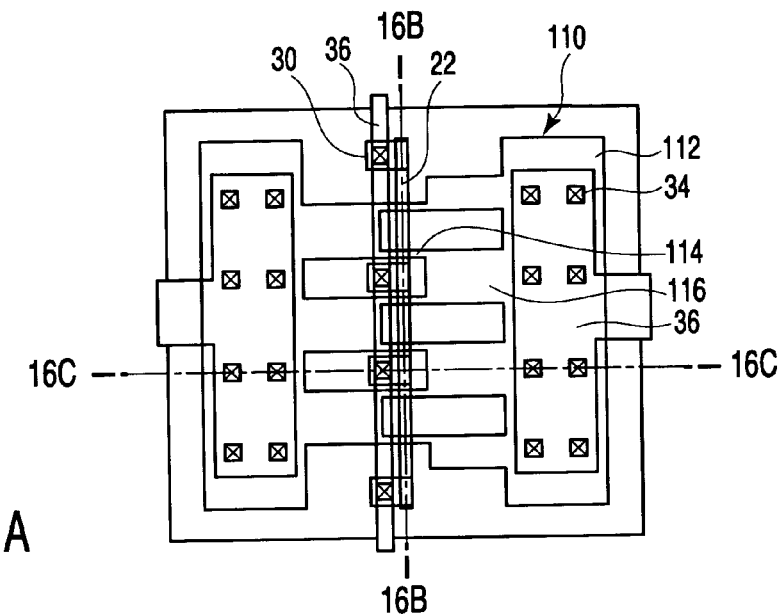
FIGS. 16A to 16C are views illustrating an example of a double gate multi Fin-FET according to a fifth modification of the present invention, FIG. 16A being a plane layout view, FIG. 16B being a sectional view along a gate electrode indicated by a line 16B-16B in FIG. 16A, and FIG. 16C being a sectional view of a direction perpendicular to the gate electrode indicated by a line 16C-16C in FIG. 16A.
Figure 16B:
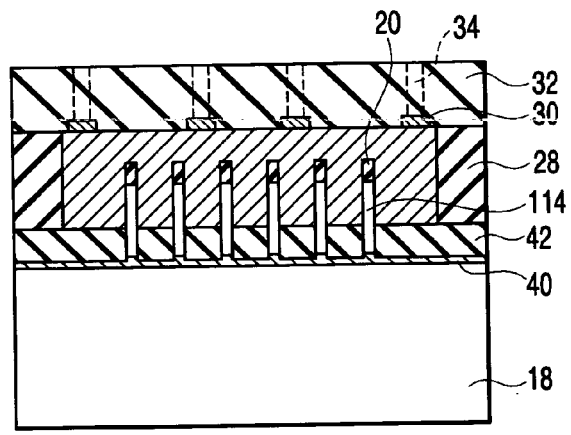
Figure 16C:
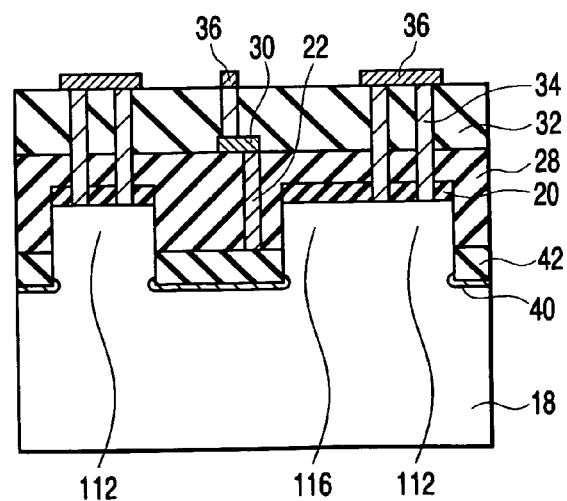

As in the case of the second embodiment, the double gate multi Fin-FET of the third embodiment can be modified to use a bulk silicon substrate 18 in place of the SOI substrate 10. FIGS. 16A to 16C show an example of a double gate multi Fin-FET according to a modification 5. FIG. 16A is a plane layout view, FIG. 16B is a sectional view along a gate electrode 22 indicated by a line 16B-16B in FIG. 16A, and FIG. 16C is a sectional view of a direction perpendicular to the gate electrode 22 indicated by a line 16C-16C in FIG. 16A.

As the third embodiment is realized by changing the first embodiment, the modification is realized by changing the second embodiment. That is, only by changing the formation process of the gate electrode 22 and the patterns of the pad electrode 30 and the gate wiring 36 in the second embodiment, it can be formed the double gate multi Fin-FET by using the bulk silicon substrate 18.

(Modification 6)

Figure 17A:
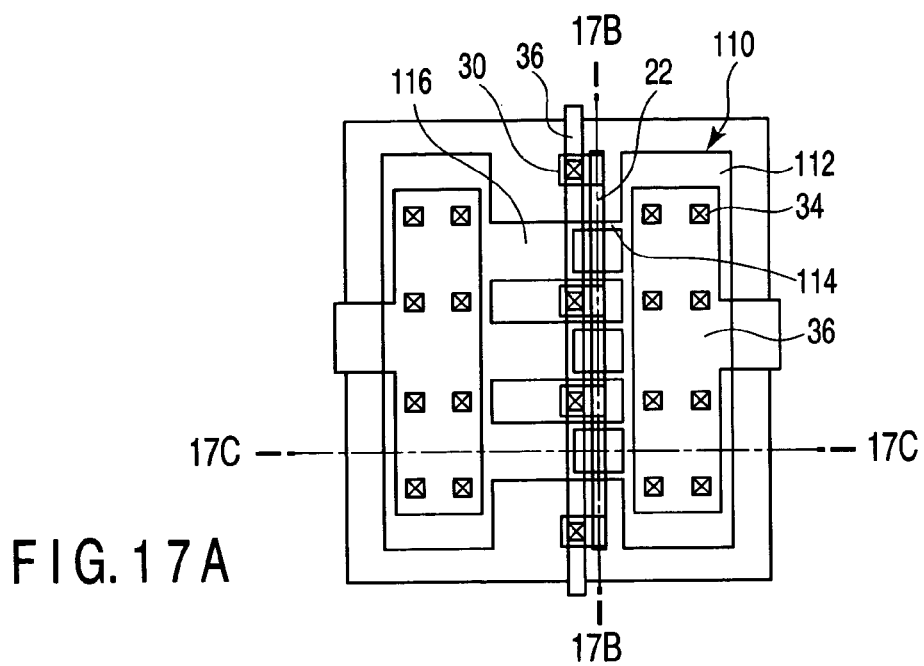
FIGS. 17A to 17C are views illustrating an example of a double gate multi Fin-FET according to a sixth modification of the present invention, FIG. 17A being a plane layout view, FIG. 17B being a sectional view along a gate electrode indicated by a line 17B-17B in FIG. 17A, and FIG. 17C being a sectional view of a direction perpendicular to the gate electrode indicated by a line 17C-17C in FIG. 17A.
Figure 17B:
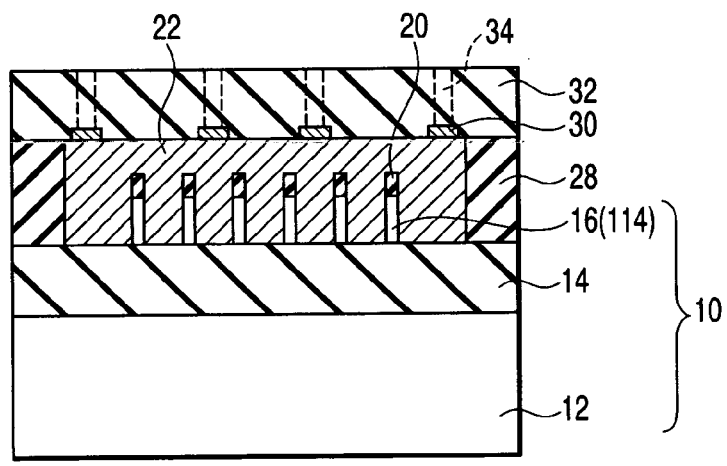
Figure 17C:
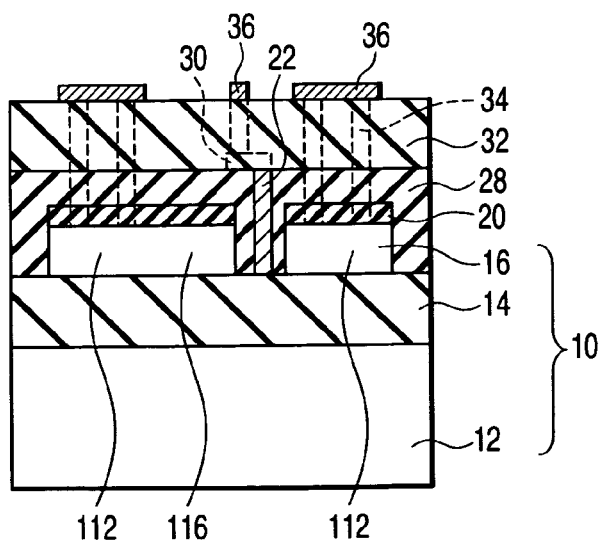

A modification 6 is a case in which a stretched region 116 is formed only on one side of a double gate multi Fin-FET of the third embodiment using the SOI substrate 10. FIGS. 17A to 17C show an example therein FIG. 17A is a plane layout view, FIG. 17B is a sectional view along a gate electrode 22 indicated by a line 17B-17B in FIG. 17A, and FIG. 17C is a sectional view of a direction perpendicular to the gate electrode 22 indicated by a line 17C-17C in FIG. 17A.

As in the case of the modification 1, by forming the stretched region 116 only from a source side, it can be reduced a parasitic resistance and suppressed a deterioration in the current driving force.

The modification can also use the bulk silicon substrate 18 (not shown).

As described above, according to the present invention, it can be provided the semiconductor device comprising a multi Fin-FET structure capable of suppressing the short channel effects, controlling the threshold voltage, driving a high current, and operating in a high-speed, and its manufacturing method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   a source region and a drain region disposed on a semiconductor substrate;
   a plurality of fins which interconnect the source region and the drain region;
   a plurality of first gate electrodes, each first gate electrode disposed on the semiconductor substrate and to one side face of each fin;
   a plurality of second gate electrodes, each second gate electrode disposed on the semiconductor substrate and to the other side face of the fin to face a respective of the first gate electrodes with respect to the fin, and separated from the first gate electrodes;
   a plurality of first pad electrodes connected to respective of the first gate electrodes;
   a first wiring which interconnects the plurality of first pad electrodes;
   a plurality of second pad electrodes connected to respective of the second gate electrodes; and
   a second wiring which interconnects the plurality of second pad electrodes.

2. The semiconductor device according to claim 1, wherein potentials of the first gate electrodes are controlled independently of the second gate electrodes.

3. The semiconductor device according to claim 1, further comprising a plurality of stretched regions stretched from the source region or the drain region toward the first or second gate electrodes, and formed to be connected to one or two adjacent fins.

4. The semiconductor device according to claim 3, wherein the stretched region from the source region and the stretched region from the drain region are alternately arranged.

5. The semiconductor device according to claim 3, wherein the stretched region is formed only from the source region.

6. The semiconductor device according to claim 3, wherein the first and second pad electrodes are arranged not to overlap with the stretched region.

7. The semiconductor device according to claim 2, further comprising a plurality of stretched regions stretched from the source region or the drain region toward the first or second gate electrode, and formed to be connected to one or two adjacent fins.

8. The semiconductor device according to claim 7, wherein the stretched regions from the source region and the stretched regions from the drain region are alternately arranged.

9. The semiconductor device according to claim 7, wherein the stretched regions are formed only from the source region.

10. The semiconductor device according to claim 7, wherein the first and second pad electrodes are arranged not to overlap with the stretched regions.

11. The semiconductor device according to claim 1, wherein a channel is formed only in one side face of each fin.

12. The semiconductor device according to claim 1, wherein the plurality of first gate electrodes are arranged alternately with the plurality of second gate electrodes.

13. The semiconductor device according to claim 1, wherein each of the plurality of second gate electrodes is alternately arranged with each of the plurality of first gate electrodes disposing each one of the plurality of fins inbetween, wherein the plurality of the first pad electrodes are disposed in a source region side of the first or second gate electrodes, and wherein the plurality of the second pad electrodes are disposed in a drain region side of the first or second gate electrodes.

14. The semiconductor device according to claim 13, further comprising a plurality of stretched regions each of which are stretched from the source region or the drain region toward the first or second gate electrode and formed to be connected to two adjacent fins.

15. The semiconductor device according to claim 14, wherein the plurality of fins include a first fin, a second fin disposed adjacent to the first fin, and a third fin disposed adjacent to the second fin, and wherein the plurality of stretched regions include a first stretched region stretched from the drain region toward the first gate electrode and connected to the first fin and the second fin and a second stretched region stretched from the source region toward the second gate electrode and connected to the second fin and the third fin.

16. The semiconductor device according to claim 13, further comprising a plurality of stretched regions, wherein the plurality of fins include a first fin, a second fin disposed adjacent to the first fin, and a third fin disposed adjacent to the second fin, and wherein the plurality of stretched regions include a first stretched region stretched from the drain region toward the first gate electrode and connected to the first fin and the second fin, and a second stretched region stretched from the source region toward the second gate electrode and connected to the second fin and the third fin.

17. The semiconductor device according to claim 3, wherein the plurality of fins include a first fin, a second fin disposed adjacent to the first fin, and a third fin disposed adjacent to the second fin, and wherein the plurality of stretched regions include a first stretched region stretched from the drain region toward the first gate electrode and connected to the first fin and the second fin, and a second stretched region stretched from the source region toward the second gate electrode and connected to the second fin and the third fin.

18. The semiconductor device according to claim 5, wherein a distance between the first and second gate electrodes and the source region is larger than a distance between the first and second gate electrodes and the drain region.

* * * * *